(12) United States Patent
Takaya et al.

(10) Patent No.: US 11,917,844 B2
(45) Date of Patent: Feb. 27, 2024

(54) ORGANIC EL ELEMENT, AND DISPLAY APPARATUS, ILLUMINATION APPARATUS, AND MOVING OBJECT INCLUDING THE SAME

(71) Applicant: CANON KABUSHIKI KAISHA, Tokyo (JP)

(72) Inventors: Itaru Takaya, Kanagawa (JP); Naoki Yamada, Tokyo (JP); Takayuki Ito, Kanagawa (JP); Hirokazu Miyashita, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 723 days.

(21) Appl. No.: 17/077,991

(22) Filed: Oct. 22, 2020

(65) Prior Publication Data

US 2021/0057665 A1  Feb. 25, 2021

Related U.S. Application Data

(63) Continuation of application No. PCT/JP2019/016098, filed on Apr. 15, 2019.

(30) Foreign Application Priority Data

Apr. 26, 2018 (JP) .................. 2018-085873

(51) Int. Cl.
*H10K 50/13* (2023.01)
*H05B 33/02* (2006.01)
*H10K 50/11* (2023.01)
*H10K 101/40* (2023.01)

(52) U.S. Cl.
CPC ............. *H10K 50/13* (2023.02); *H05B 33/02* (2013.01); *H10K 50/11* (2023.02); *H10K 2101/40* (2023.02)

(58) Field of Classification Search
CPC ......... H10K 50/11; H10K 50/12; H10K 50/13
USPC ....................................................... 313/504
See application file for complete search history.

(56) References Cited

U.S. PATENT DOCUMENTS

2011/0248249 A1* 10/2011 Forrest ................... H10K 50/11
257/40
2016/0365527 A1   12/2016 Gao
2018/0090719 A1*  3/2018 Han ....................... H10K 50/11
(Continued)

FOREIGN PATENT DOCUMENTS

| JP | 2007-027092 A | 2/2007 |
| JP | 2008-533674 A | 8/2008 |
| JP | 2008-270190 A | 11/2008 |

(Continued)

*Primary Examiner* — Christopher M Raabe
(74) *Attorney, Agent, or Firm* — Canon U.S.A., Inc., IP Division

(57) ABSTRACT

An organic EL element characterized by including a first electrode, a second electrode, and a first light-emitting layer, a second light-emitting layer, and a third light-emitting layer that are disposed between the first electrode and the second electrode, the first light-emitting layer, the second light-emitting layer, and the third light-emitting layer each containing a host material and a light-emitting material, in which the first light-emitting layer is a light-emitting layer that emits red light and green light, the second light-emitting layer is a light-emitting layer that emits blue light, and the third light-emitting layer is a light-emitting layer that emits green light.

20 Claims, 11 Drawing Sheets

(56) References Cited

U.S. PATENT DOCUMENTS

2019/0267436 A1\* 8/2019 Zhang ................ H10K 59/1213
2021/0098730 A1\* 4/2021 Wu ........................ H10K 50/11

FOREIGN PATENT DOCUMENTS

| JP | 2009-093981 A | 4/2009 |
| JP | 2010-161071 A | 7/2010 |
| JP | 2010-225382 A | 10/2010 |
| JP | 2012-507175 A | 3/2012 |
| JP | 2013-112608 A | 6/2013 |
| JP | 2013-179088 A | 9/2013 |
| JP | 2014-022205 A | 2/2014 |
| JP | 2014-110348 A | 6/2014 |
| JP | 2015-232994 A | 12/2015 |
| WO | 2010062643 A1 | 6/2010 |
| WO | 2010/134350 A1 | 11/2010 |
| WO | 2018/048074 A1 | 3/2018 |

\* cited by examiner

ORGANIC EL ELEMENT, AND DISPLAY APPARATUS, ILLUMINATION APPARATUS, AND MOVING OBJECT INCLUDING THE SAME

CROSS-REFERENCE TO RELATED APPLICATIONS

This application is a Continuation of International Patent Application No. PCT/JP2019/016098, filed Apr. 15, 2019, which claims the benefit of Japanese Patent Application No. 2018-085873, filed Apr. 26, 2018, both of which are hereby incorporated by reference herein in their entirety.

BACKGROUND OF THE INVENTION

Field of the Invention

The present invention relates to an organic electroluminescent (EL) element that is capable of emitting white light and has a good balance of light emission, and a display apparatus, an illumination apparatus, and a moving object that include the organic EL element.

Background Art

In recent years, research and development has been intensively conducted on full-color light-emitting arrays including organic EL elements. In the case of producing such a full-color light-emitting array, different light-emitting layers may be individually arranged for pixels (elements), or white organic EL elements each including a white-light-emitting layer and individually provided with any of red, green, and blue color filters for pixels may be used. With regard to the white organic EL elements, it is known that light-emitting materials that emit light of three colors, namely, red, green, and blue, suitable for the color filters are used.

Japanese Patent Laid-Open No. 2010-225382 (hereinafter referred to as PTL 1) discloses a white organic EL element including three light-emitting layers that are stacked to be adjacent to each other. The three light-emitting layers contain the same host material to reduce the driving voltage of the element, and a second host material is introduced in a red-light-emitting layer so that excitation energy is transferred to a red-light-emitting material.

Japanese Patent Laid-Open No. 2008-270190 (hereinafter referred to as PTL 2) discloses a white organic EL element including three light-emitting layers. In the white organic EL element, a dual-color light-emitting layer constituted by a single light-emitting layer containing a red-light-emitting material and a green-light-emitting material, a blue-light-emitting layer that emits monochromatic blue light, and a dual-color light-emitting layer constituted by a single light-emitting layer containing a red-light-emitting material that emits monochromatic red light and a green-light-emitting material are stacked in this order to be adjacent to each other, and these light-emitting layers contain the same host material. With this configuration, stability to emission chromaticity with respect to a change in the driving current is improved.

Japanese Patent Laid-Open No. 2014-22205 (hereinafter referred to as PTL 3) discloses a white organic EL element including two light-emitting layers. In the white organic EL element, a dual-color light-emitting layer constituted by a single light-emitting layer containing a red-light-emitting material and a green-light-emitting material, and a blue-light-emitting layer that emits monochromatic blue light are stacked to be adjacent to each other, and these light-emitting layers contain the same host material. With this configuration, the driving voltage of the element is reduced.

International Publication No. 2010/134350 (hereinafter referred to as PTL 4) discloses a white organic EL element in which three light-emitting layers are stacked, and a charge barrier layer is disposed between a red-light-emitting layer and a blue-light-emitting layer. With this configuration, the balance of light emission among red, green, and blue is improved.

CITATION LIST

Patent Literature

PTL1: Japanese Patent Laid-Open No. 2010-225382
PTL2: Japanese Patent Laid-Open No. 2008-270190
PTL3: Japanese Patent Laid-Open No. 2014-22205
PTL4: International Publication No. 2010/134350

However, the white organic EL elements disclosed in PTL 1 to PTL 4 are organic EL elements which have a poor balance of light emission and in which a change in chromaticity of white light emission is large.

SUMMARY OF THE INVENTION

The present invention provides an organic EL element including a first electrode, a second electrode, and a first light-emitting layer, a second light-emitting layer, and a third light-emitting layer that are disposed between the first electrode and the second electrode, the first light-emitting layer, the second light-emitting layer, and the third light-emitting layer each containing a host material and a light-emitting material, in which the first light-emitting layer is a light-emitting layer that emits red light and green light, the second light-emitting layer is a light-emitting layer that emits blue light, and the third light-emitting layer is a light-emitting layer that emits green light.

Further features of the present invention will become apparent from the following description of exemplary embodiments with reference to the attached drawings.

DESCRIPTION OF THE EMBODIMENTS

An organic EL element according to the present invention is one which has a good balance of light emission and in which a change in chromaticity of white light emission is small because the organic EL element has the configurations described below.

In the present specification, the phrase "having a good balance of light emission" means that with regard to the currents necessary for red, green, and blue during white (CIE chromaticity coordinates: 0.31, 0.33) display at 500 cd/cm$^2$ in the case where red, green, and blue color filters are formed on white organic EL elements, the current necessary for a color of the lowest current value is 80% or more of the current necessary for a color of the highest current value.

(1) The first light-emitting layer is a dual-color light-emitting layer that emits red light and green light, the second light-emitting layer is a blue-light-emitting layer, and the third light-emitting layer is a green-light-emitting layer.

A first light-emitting layer 4-1 contains a red dopant material and a green dopant material which are light-emitting materials, and the first light-emitting layer is a dual-color light-emitting layer that emits red light and green light. The first light-emitting layer 4-1 is capable of emitting light of two colors, namely, red and green. When a green dopant and a red dopant are contained in the same light-emitting layer, red light emission tends to be stronger than green light emission. That is, if a light-emitting layer that emits green light is formed of only a light-emitting layer that contains both red and green dopants, it may be difficult to adjust the balance between red light emission and green light emission as the light emission of the whole of the organic EL element.

Therefore, in the present invention, a third light-emitting layer, which is a green-light-emitting layer, is provided to improve the luminance of green light, and green light is emitted from the two light-emitting layers, namely, the first light-emitting layer and the third light-emitting layer. Since the organic EL element includes two light-emitting layers that emit green light, a change in the chromaticity of white light emission of the organic EL element can be reduced.

Figure 1A:
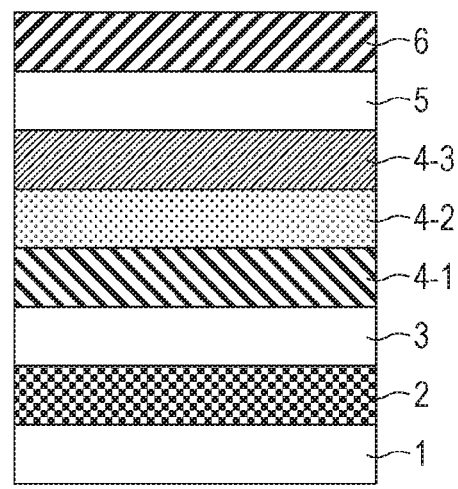
FIG. 1A is a schematic sectional view illustrating an example of an organic EL element according to the present invention.

FIG. 1 includes schematic sectional views each illustrating an organic EL element according to this embodiment. In the organic EL element illustrated in FIG. 1A, an anode 2, a hole transport layer 3, a first light-emitting layer 4-1, a second light-emitting layer 4-2, a third light-emitting layer 4-3, an electron transport layer 5, and a cathode 6 are sequentially stacked on a substrate 1 in this order. The first light-emitting layer 4-1, the second light-emitting layer 4-2, and the third light-emitting layer 4-3 each contain a host material and a light-emitting material. The stacking order of the first light-emitting layer, the second light-emitting layer, and the third light-emitting layer is not limited.

In the present specification, a light-emitting layer refers to, among organic compound layers disposed between the anode and the cathode, a layer having a function of emitting light. A host material contained in a light-emitting layer refers to, among materials contained in the light-emitting layer, a material having the highest concentration. To reduce the driving voltage of the organic EL element, the concentration of the host material is preferably high, preferably 90% by weight or more, and more preferably 95% by weight or more.

On the other hand, a dopant material refers to, among materials contained in the light-emitting layer, a material having a lower concentration than the host material. A red dopant material means a material that emits red light. This also applies to dopants of other colors.

In the present specification, among light components, a light-emitting component having a maximum emission wavelength of 570 nm to 650 nm is defined as red light, and a light-emitting material that emits the red light is referred to as a red dopant material. A light-emitting component having a maximum emission wavelength of 490 nm to 540 nm is defined as green light, and a light-emitting material that emits the green light is referred to as a green dopant material. A light-emitting component having a maximum emission wavelength of 430 nm to 480 nm is defined as blue light, and a light-emitting material that emits the blue light is referred to as a blue dopant material.

Figure 1B:
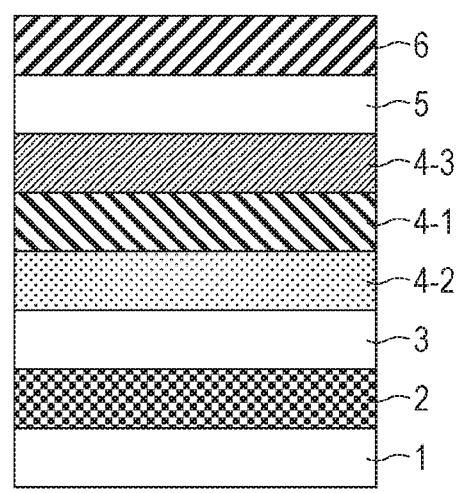
FIG. 1B is a schematic sectional view illustrating another example of the organic EL element according to the present invention.
Figure 1C:
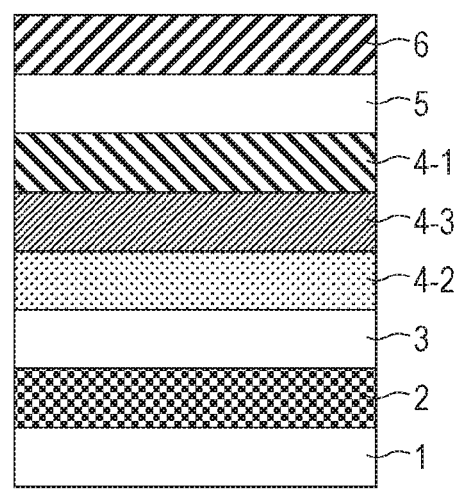
FIG. 1C is a schematic sectional view illustrating another example of the organic EL element according to the present invention.

The first light-emitting layer 4-1 is a light-emitting layer that emits red light and green light and contains, as light-emitting materials, two dopant materials, namely, a red dopant material and a green dopant material. In FIG. 1A, the first light-emitting layer 4-1 is a light-emitting layer positioned first from the side of the anode 2. Alternatively, as illustrated in FIG. 1B and FIG. 1C, the first light-emitting layer 4-1 may be a light-emitting layer positioned second or third from the side of the anode 2. That is, among the three light-emitting layers, at least one light-emitting layer is a dual-color light-emitting layer that contains two dopant materials, namely, a red dopant material and a green dopant material and that emits red light and green light.

The second light-emitting layer 4-2 is a light-emitting layer that emits blue light and contains a blue dopant as a light-emitting material.

The third light-emitting layer 4-3 is a light-emitting layer that emits green light and contains a green dopant as a light-emitting material. Preferably, the second light-emitting layer and the third light-emitting layer contain no light-emitting materials that emit light of other colors. In particular, the third light-emitting layer is a light-emitting layer for adjusting the amount of emission of green light, and thus preferably has a configuration in which the amount of emission of green light is not reduced. Specifically, the third light-emitting layer preferably contains, as a light-emitting dopant, a green dopant alone. The third light-emitting layer may be a light-emitting layer composed only of a host material and a green dopant. The light emission from the third light-emitting layer may be emission of light that does not include a wavelength of red light emission.

The second light-emitting layer and the third light-emitting layer may contain other materials as long as light emission from the light-emitting layers is not impaired, although the configurations described above are preferred. Specifically, the second light-emitting layer and the third light-emitting layer may contain a plurality of host materials or may contain a material that assists energy transfer, which is called an assist material.

Furthermore, in the configuration illustrated in FIG. 1, a hole injection layer may be disposed between the anode 2 and the hole transport layer 3, and an electron blocking layer may be disposed between the hole transport layer 3 and the light-emitting layer.

Furthermore, a hole blocking layer may be disposed between the light-emitting layer and the electron transport layer 5, and an electron injection layer may be disposed between the electron transport layer 5 and the cathode 6. The hole injection layer, the electron blocking layer, the hole blocking layer, and the electron injection layer may be appropriately used, if necessary.

The organic EL element according to this embodiment provides a more preferred organic EL element when the organic EL element satisfies the configurations described below.

(2) The three light-emitting layers, namely, the first light-emitting layer, the second light-emitting layer, and the third light-emitting layer are formed to be adjacent to each other.

In the organic EL element according to this embodiment, preferably, the three light-emitting layers, namely, the first light-emitting layer 4-1, the second light-emitting layer 4-2, and the third light-emitting layer 4-3 are stacked without another layer disposed therebetween, and another layer such as a charge barrier layer is not interposed between the light-emitting layers, as illustrated in FIG. 1A, FIG. 1B, and FIG. 1C.

Specifically, preferably, the first light-emitting layer is disposed in contact with the second light-emitting layer and the second light-emitting layer is disposed in contact with the third light-emitting layer, the first light-emitting layer is disposed in contact with the third light-emitting layer and the second light-emitting layer is disposed in contact with the third light-emitting layer, or the second light-emitting layer is disposed in contact with the first light-emitting layer and the first light-emitting layer is disposed in contact with the third light-emitting layer.

Forming the light-emitting layers to be adjacent to each other is based on the consideration of the driving voltage of the element. This arrangement provides the effect of reducing the electrical resistance generated when another layer is interposed and the effect of reducing an increase in the voltage due to a transfer of electric charges (holes and electrons) in the light-emitting layers to a level of the other layer.

(3) All the host materials of the three light-emitting layers are the same material.

In the organic EL element according to this embodiment, all the host materials of the three light-emitting layers, namely, the first light-emitting layer 4-1, the second light-emitting layer 4-2, and the third light-emitting layer 4-3 are preferably the same material. This configuration provides the effect of reducing the driving voltage of the organic EL element. Specifically, when the light-emitting layers containing the same host material are formed to be adjacent to each other, it is possible to reduce an increase in the voltage due to a transfer of electric charges (holes and electrons) in the light-emitting layers to a level of another host material.

Furthermore, in the organic EL element according to this embodiment, since the first light-emitting layer contains a red dopant material and a green dopant material, the organic EL element can efficiently emit red light even when the first to third light-emitting layers contain the same host material. In the case where a host material is selected on the basis of the energy level of a blue dopant material, there is a large difference between the energy level of a red dopant material and the energy level of the host material, and thus the energy transfer may occur at low efficiency. However, in the organic EL element according to this embodiment, since the first light-emitting layer contains a green dopant material together with a red dopant material, energy can be efficiently transferred to the red dopant material through the green dopant material. Therefore, even when the first to third light-emitting layers contain the same host material, the organic EL element can efficiently emit red light.

(4) The host material, the red dopant material, and the green dopant material of the first light-emitting layer satisfy relations (i) and (ii) below.

$$\text{LUMO}(H1) < \text{LUMO}(RD) \qquad (i)$$

$$\text{LUMO}(H1) < \text{LUMO}(GD) \qquad (ii)$$

In (i) and (ii), LUMO (H1), LUMO (RD), and LUMO (GD) represent an absolute value of a LUMO energy of the host material of the first light-emitting layer, an absolute value of a LUMO energy of the red dopant material, and an absolute value of a LUMO energy of the green dopant material, respectively.

Figure 2:
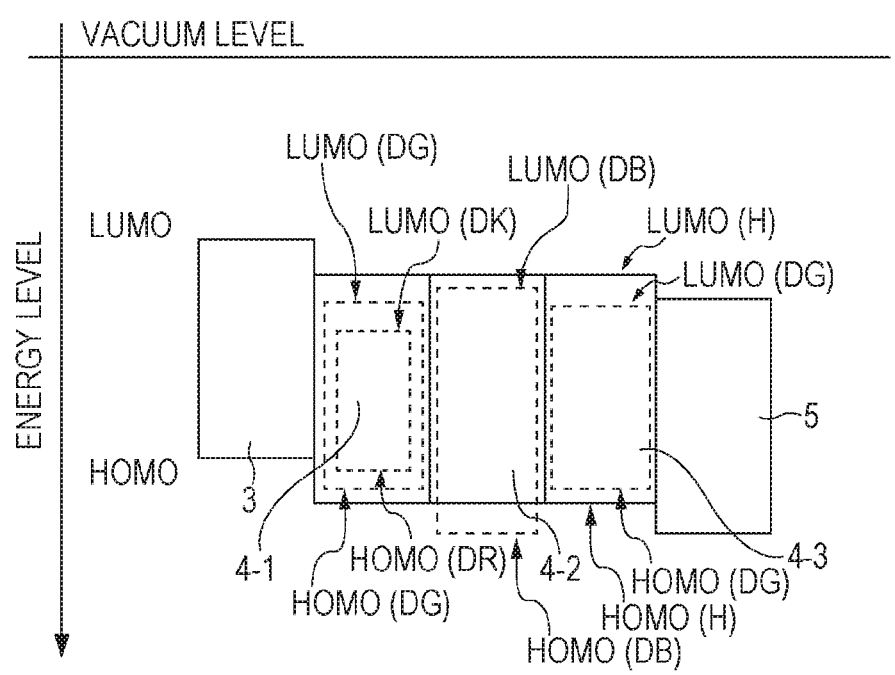
FIG. 2 is an energy diagram that schematically illustrates the energy levels around light-emitting layers that form an organic EL element according to the embodiment.

FIG. 2 is an energy diagram that schematically illustrates the energy levels of light-emitting layers of the organic EL element according to the embodiment and the energy levels of layers adjacent to the light-emitting layers.

In FIG. 2, a first light-emitting layer 4-1 is positioned first from the side of an anode 2, as illustrated in FIG. 1A. Alternatively, the first light-emitting layer 4-1 may be positioned second or third from the side of the anode 2, as described above.

FIG. 2 illustrates an example in which the host materials contained in the first to third light-emitting layers are the same material, and the host materials, the red dopant material, and the green dopant material satisfy the relations (i) and (ii) in the first light-emitting layer. Since the host materials in the first to third light-emitting layers are the same material, LUMO (H1) is expressed as LUMO (H).

When the relations described here are satisfied, the red dopant material and the green dopant material have deeper LUMO levels than the host material. Consequently, electrons or excitation energy can be efficiently delivered from the host material to both the red dopant material and the green dopant material. Accordingly, both the two light-emitting materials can emit light.

The values of HOMO energy and LUMO energy are determined with respect to the vacuum level and are negative in the case of typical molecules. In the present specification, when the values of HOMO energy and LUMO energy are compared by using a sign of inequality, the magnitude of each value is used. Large absolute values may be expressed as "deep" or "low", and small absolute values may be expressed as "shallow" or "high".

In the present invention, numerical values determined by molecular orbital calculations are used as HOMO energy and LUMO energy. The calculation technique of the molecular orbital calculations used was the density functional theory (DFT), which has been currently widely used. The B3LYP was used as the functional, and the 6-31G* was used as the basis function. The molecular orbital calculations were conducted by using Gaussian09 (Gaussian09, Revision C.01, M. J. Frisch, G. W. Trucks, H. B. Schlegel, G. E. Scuseria, M. A. Robb, J. R. Cheeseman, G. Scalmani, V. Barone, B. Mennucci, G. A. Petersson, H. Nakatsuji, M. Caricato, X. Li, H. P. Hratchian, A. F. Izmaylov, J. Bloino, G. Zheng, J. L. Sonnenberg, M. Hada, M. Ehara, K. Toyota, R. Fukuda, J. Hasegawa, M. Ishida, T. Nakajima, Y. Honda, O. Kitao, H. Nakai, T. Vreven, J. A. Montgomery, Jr., J. E.

Peralta, F. Ogliaro, M. Bearpark, J. J. Heyd, E. Brothers, K. N. Kudin, V. N. Staroverov, T. Keith, R. Kobayashi, J. Normand, K. Raghavachari, A. Rendell, J. C. Burant, S. S. Iyengar, J. Tomasi, M. Cossi, N. Rega, J. M. Millam, M. Klene, J. E. Knox, J. B. Cross, V. Bakken, C. Adamo, J. Jaramillo, R. Gomperts, R. E. Stratmann, O. Yazyev, A. J. Austin, R. Cammi, C. Pomelli, J. W. Ochterski, R. L. Martin, K. Morokuma, V. G. Zakrzewski, G. A. Voth, P. Salvador, J. J. Dannenberg, S. Dapprich, A. D. Daniels, O. Farkas, J. B. Foresman, J. V. Ortiz, J. Cioslowski, and D. J. Fox, Gaussian, Inc., Wallingford CT, 2010.), which has been currently widely used.

In Examples described below, calculated values determined by the molecular orbital calculations are compared with measured values to verify the accuracy of the calculated values.

(5) The green dopant material in the first light-emitting layer has a concentration of 0.1% by weight or more and less than 10% by weight.

In a light-emitting layer containing both a green dopant material and a red dopant material, red light emission tends to be stronger than green light emission. Therefore, the green dopant material in the first light-emitting layer preferably has a concentration of 0.1% by weight or more, and more preferably 1% by weight or more. A green dopant material concentration of 0.1% by weight or more is preferred because the emission of green light easily contributes to the balance of light emission.

On the other hand, the green dopant material in the first light-emitting layer preferably has a concentration of less than 10% by weight, and more preferably less than 5% by weight. In this embodiment, the host material preferably has a high concentration from the viewpoint of reducing the driving voltage. Accordingly, less than 10% by weight of the green dopant material is preferred because the host material has a high concentration.

(6) The anode is a reflective electrode that reflects light, the cathode is a transmissive electrode that transmits light, and the anode, the first light-emitting layer, the second light-emitting layer, the third light-emitting layer, and the cathode are disposed in this order.

In the organic EL element according to this embodiment, when the anode is a reflective electrode and the cathode is a transmissive electrode, the anode, the first light-emitting layer, the second light-emitting layer, the third light-emitting layer, and the cathode are preferably disposed in this order. Herein, being reflective refers to a property of reflecting 50% or more of light emitted from the element, and being transmissive refers to a property of transmitting 50% or more of light emitted from the element.

A red-light-emitting material has a narrow band gap and more easily traps electrons than materials that emit light of other colors. Accordingly, when the red-light-emitting material is disposed on a side closest to the anode, electrons are also easily supplied to the green-light-emitting layer and the blue-light-emitting layer. Specifically, the first light-emitting layer is preferably disposed on the anode side.

Regarding the positional relationship between the green-light-emitting layer and the blue-light-emitting layer, the blue-light-emitting layer that emits light with a short wavelength is preferably disposed on a side closer to the reflective electrode, and the green-light-emitting layer that emits light with a long wavelength is preferably disposed on a side farther from the reflective electrode. This structure is preferred because the light-extraction efficiency of emitted light is increased by the interference with light reflected by the reflective electrode, and this enables the element to emit light at a low voltage. That is, the second light-emitting layer is preferably disposed closer to the anode than the third light-emitting layer.

Accordingly, when the anode is a reflective electrode that reflects light, the cathode is a transmissive electrode that transmits light, and the anode, the first light-emitting layer, the second light-emitting layer, the third light-emitting layer, and the cathode are disposed in this order, the driving voltage of the organic EL element can be reduced.

(7) In the third light-emitting layer, the host material and the green dopant material satisfy a relation (iii) below.

$$\text{LUMO}(H3) < \text{LUMO}(GD) \qquad (iii)$$

In (iii), LUMO (H3) and LUMO (GD) represent an absolute value of a LUMO energy of the host material and an absolute value of a LUMO energy of the green dopant material, respectively.

FIG. 2 illustrates an example in which the host materials contained in the first to third light-emitting layers are the same material, and the host material and a green dopant material satisfy the relation (iii) in the third light-emitting layer. Since the host materials in the first to third light-emitting layers are the same material, LUMO (H3) in the formula is expressed as LUMO (H) in FIG. 2.

When the light-emitting layer satisfies the relation (iii), the green dopant material traps electrons. Among the three light-emitting layers, the third light-emitting layer, which is a green-light-emitting layer, is preferably disposed on a side closest to the cathode because the third light-emitting layer can trap electrons earlier than the other light-emitting layers, and the luminance of green light emission increases in this case.

The organic EL element according to this embodiment emits light of two colors, namely, red light and green light from the first light-emitting layer. In this case, red light emission tends to be stronger than green light emission. Therefore, the luminance of green light emitted from the third light-emitting layer is preferably increased.

(8) In the second light-emitting layer, the host material and the blue dopant material satisfy relations (iv) and (v) below.

$$\text{LUMO}(H2) < \text{LUMO}(BD) \qquad (iv)$$

$$\text{HOMO}(H2) < \text{HOMO}(BD) \qquad (v)$$

In (iv) and (v), LUMO (H2) and LUMO (BD) represent an absolute value of a LUMO energy of the host material and an absolute value of a LUMO energy of the blue dopant material, respectively, and HOMO (H2) and HOMO (BD) represent an absolute value of a HOMO energy of the host material and an absolute value of a HOMO energy of the blue dopant material, respectively.

FIG. 2 illustrates an example in which the host materials contained in the first to third light-emitting layers are the same material, and the host material and the blue dopant material satisfy the relations (iv) and (v) in the second light-emitting layer. Since the host materials in the first to third light-emitting layers are the same material, LUMO (H2) and HOMO (H2) in the formulae are expressed as LUMO (H) and HOMO (H), respectively, in FIG. 2.

In the second light-emitting layer 4-2 in FIG. 2, the host material and the blue dopant material satisfy the relations (iv) and (v). When the light-emitting layer satisfies both the relations (iv) and (v), the blue dopant material traps holes but does not trap electrons, among electric charges. Consequently, in the second light-emitting layer, holes are unlikely to be trapped and conduct through the HOMO level of the host material, and thus easily flow, whereas electrons are trapped by the blue dopant material and thus are unlikely to flow. In the case of the configuration in which the second light-emitting layer is disposed at the center of the first to third light-emitting layers, holes are easily supplied from the second light-emitting layer, which is a blue-light-emitting layer, to the third light-emitting layer, which is a green-light-emitting layer, and electrons are unlikely to be supplied to the first light-emitting layer, which is a dual-color light-emitting layer that emits red light and green light.

In the organic EL element according to this embodiment, since the third light-emitting layer is a light-emitting layer that emits green light, the balance of light emission of the organic EL element can be maintained even if the luminance of green light from the first light-emitting layer decreases.

(9) The light-emitting material is a light-emitting dopant material having a fused ring including a five-membered ring.

In the organic EL element according to this embodiment, the LUMO level of the light-emitting dopant material is preferably deeper than the LUMO level of the host material. Such a material preferably has a fused ring including a five-membered ring. Examples thereof include fluoranthene compounds having electron-withdrawing structures. In this case, the difference in LUMO energy between the light-emitting dopant material and the host material increases, and electron-trapping properties can be enhanced.

In this embodiment, the light-emitting dopant material more preferably has no electron-donating substituted amino group. This is because if the light-emitting dopant material has a substituted amino group, the LUMO energy becomes shallow, and electron-trapping properties degrade. Furthermore, from the viewpoint of binding stability, a compound that does not have a substituted amino group, which forms a nitrogen-carbon single bond, is preferred.

Accordingly, when the dopant material is a compound that has a fused ring including a five-membered ring and that has no substituted amino group, a light-emitting layer having high electron-trapping properties can be formed. In addition, the material itself forming the light-emitting layer has high stability, and thus an organic EL element that exhibits good durability can be provided.

Here, compounds having a fused ring including a five-membered ring will be described. Fluoranthene compounds exemplified below are fused polycyclic compounds including a fluoranthene skeleton having a fused ring. Examples of the compounds having a fused ring including a five-membered ring include fused polycyclic compounds shown in FF1 to FF30 below.

Of these, dopant materials having a structure in which two or more fluoranthene molecules are fused are preferred from the viewpoint of enhancing electron-withdrawing properties to enhance electron trapping properties. Specifically, dopant materials having the skeletons of FF7 to FF13, FF16 to FF20, and FF23 to FF30 can be suitably used in the present invention.

[Chem. 1]

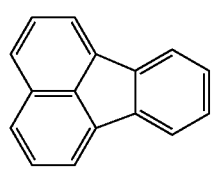

FF1

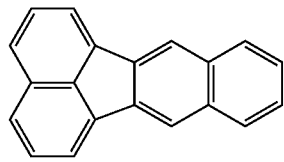

FF2

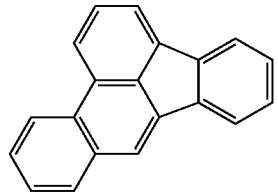

FF3

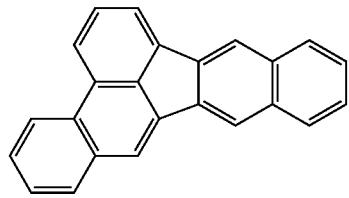

FF4

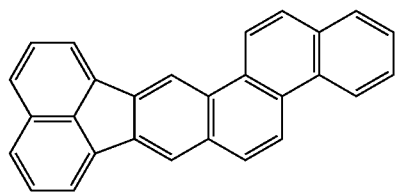

FF5

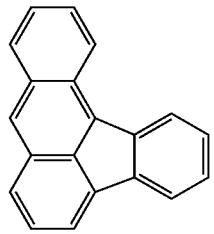

FF6

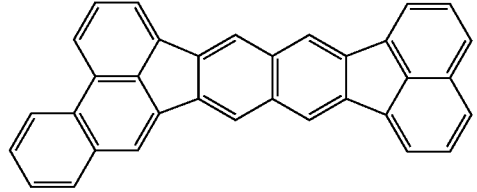

FF7

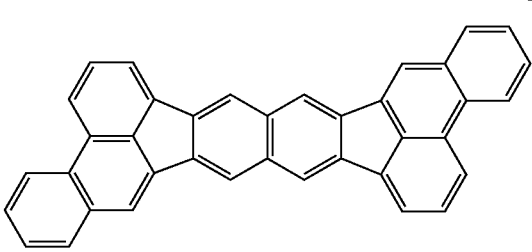

FF8

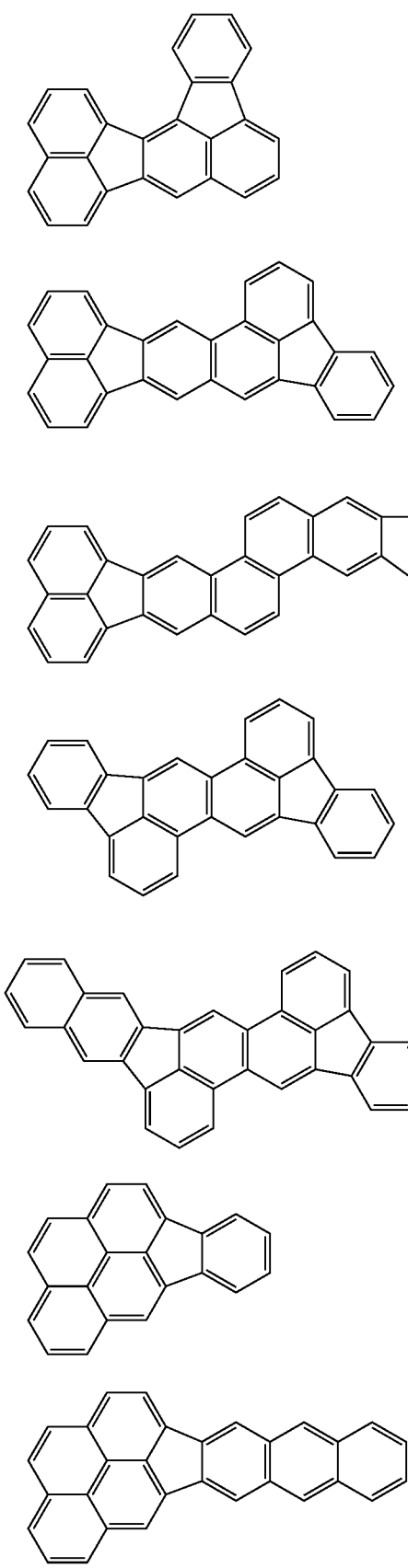
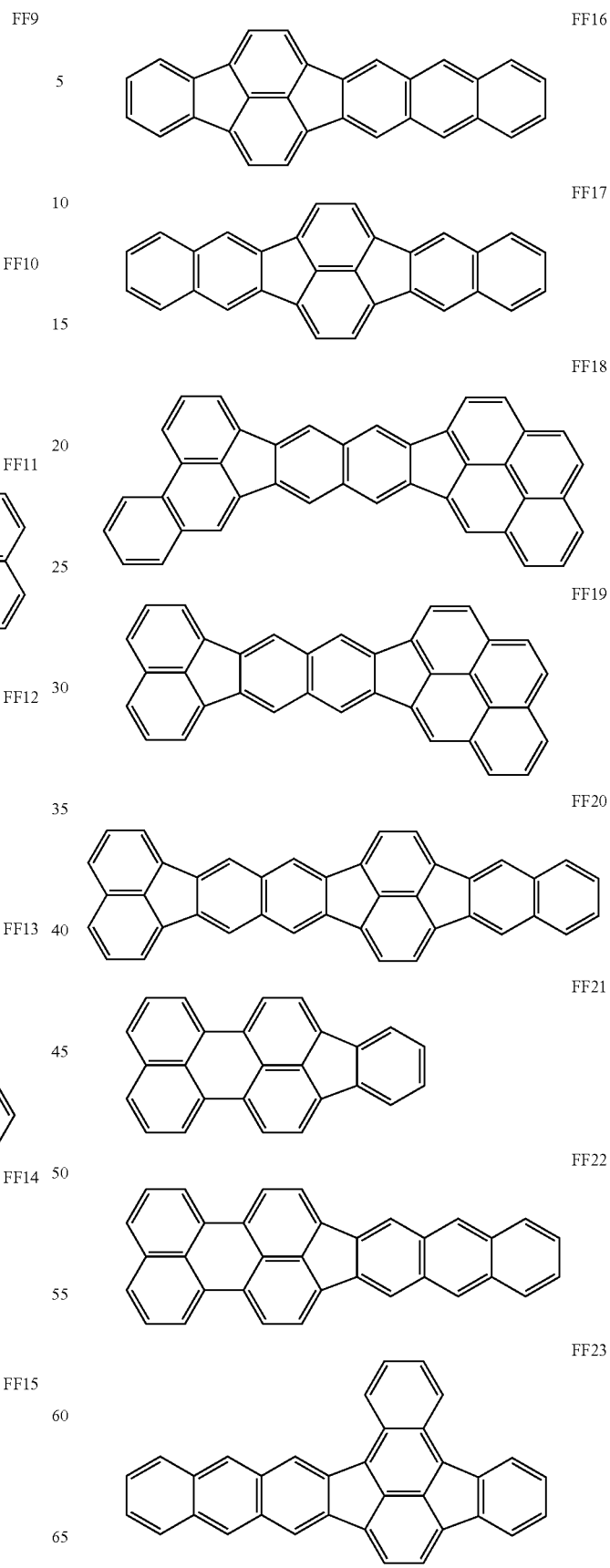

-continued

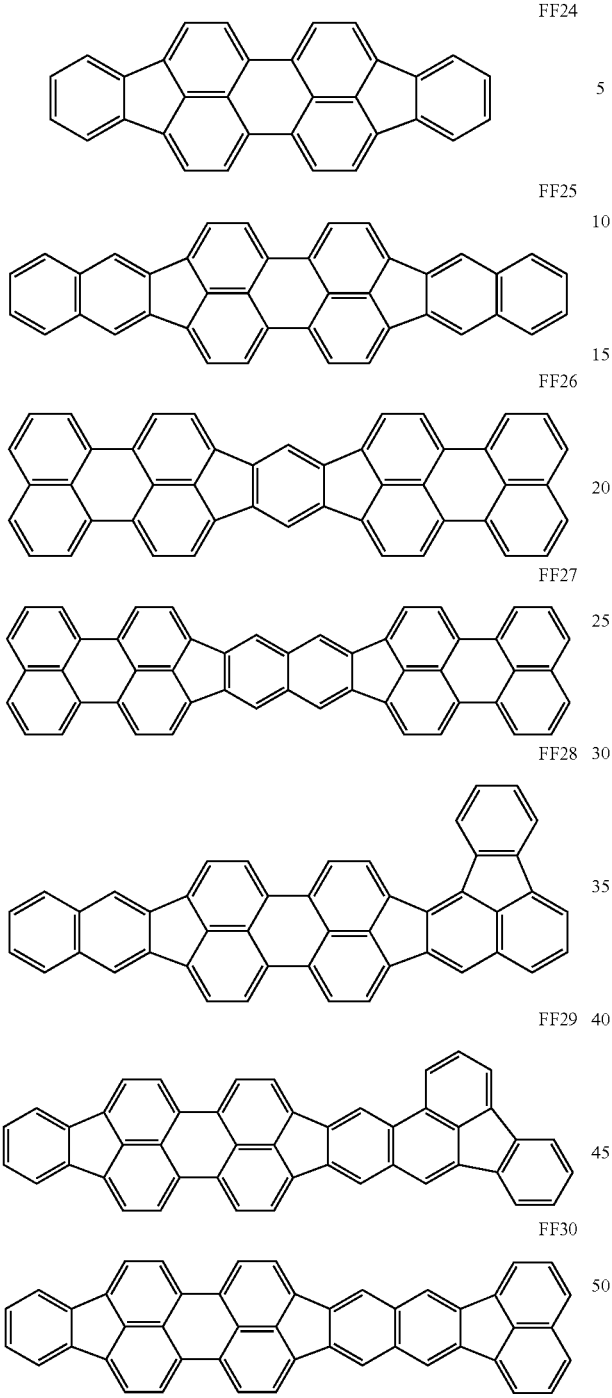

(10) The host material consists of a hydrocarbon.

In the organic EL element according to this embodiment, the host material is preferably constituted by a hydrocarbon alone. This is because the host material constituted by a hydrocarbon alone is a compound that does not have a bond having low binding stability in the molecular structure. Having such a host material is preferred because the compound is unlikely to deteriorate during driving of the element to provide an organic EL element having a long life.

The bond having low binding stability in the molecular structure refers to a bond that has a relatively low binding energy and is unstable, as in the case of an amino group.

In compounds A-1, A-2, and B-1 shown below, the bond having low binding stability is the bond linking a carbazole ring to a phenyl group and the bond linking an amino group to a phenyl group (nitrogen-carbon bonds). The bond linking carbon to carbon as shown in compound B-1 has higher binding stability than the above bonds. The above results were obtained by using a calculation technique of b3-lyp/def2-SV(P).

[Chem. 2]

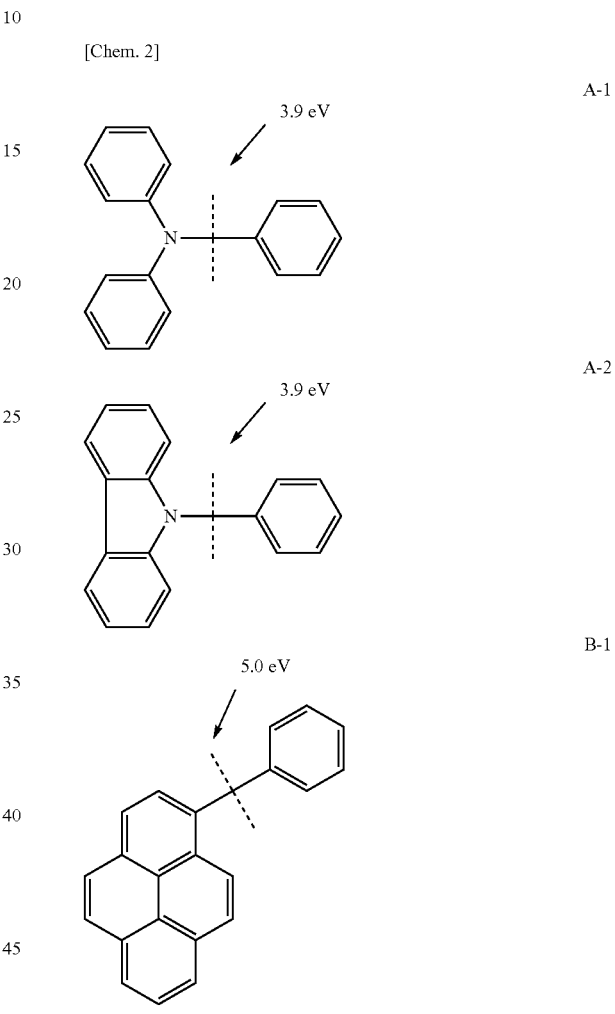

According to the above results, the host material of the organic EL element according to the present invention is preferably constituted by a material consisting of a hydrocarbon.

(11) The host material includes a structure selected from benzene, naphthalene, fluorene, benzofluorene, phenanthrene, chrysene, triphenylene, pyrene, fluoranthene, and benzofluoranthene.

The host material is an aromatic hydrocarbon compound optionally having an alkyl group having 1 to 12 carbon atoms. The aromatic hydrocarbon compound preferably includes a structure selected from benzene, naphthalene, fluorene, benzofluorene, phenanthrene, chrysene, triphenylene, pyrene, fluoranthene, and benzofluoranthene.

The organic EL element according to this embodiment uses a host material having a wide band gap so as to cause a blue dopant material to emit light. Accordingly, the host material preferably has a high exciton energy when electric charges are recombined and preferably has a structure having a high binding energy in the molecule.

Benzene, naphthalene, fluorene, benzofluorene, phenanthrene, chrysene, triphenylene, pyrene, fluoranthene, and benzofluoranthene each have a high binding energy in the molecule because they have a structure in which the number of benzene rings that are linearly fused is up to two. On the other hand, preferably, the host material does not include a structure in which three or more benzene rings are linearly fused, such as anthracene.

The structure in which the number of benzene rings that are linearly fused is up to two is resistant to bond dissociation caused by the exciton energy when electric charges are recombined, compared with the structure in which three or more benzene rings are linearly fused, such as anthracene.

Table 1 shows calculation results of the bond order and the dihedral angle of binding portions between a phenyl group and pyrene, fluoranthene, phenanthrene, and anthracene. The results show that anthracene has a large dihedral angle and a low bond order. That is, the structure in which three or more benzene rings are linearly fused results in high steric repulsion and has a low bond order accordingly. As shown below, in the case of the anthracene skeleton, hydrogens 1 and 8 of anthracene are repulsive to hydrogens 11 and 12 of the phenyl group. On the other hand, in the case of pyrene, repulsion occurs similarly between hydrogen 10 of pyrene and hydrogen 11 of the phenyl group; however, repulsion between hydrogen 2 and hydrogen 12 is weak. In addition, in the case where anthracene has a substituent at the 2-position thereof and has no substituent at the 9- or 10-position thereof, the anthracene has substitution positions with a high electron density in the central benzene ring and thus is easily oxidized. Among aromatic hydrocarbons, such anthracene compounds have low chemical stability.

Accordingly, it is considered that the structure in which the number of benzene rings that are linearly fused is up to two has a high bond order, is resistant to bond dissociation caused by the exciton energy when electric charges are recombined, and has a high binding energy, compared with the structure in which three or more benzene rings are linearly fused, such as anthracene.

[Chem. 3]

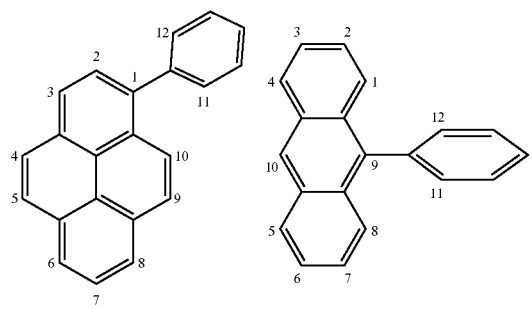

TABLE 1

| Structure | Bond order | Dihedral angle [°] |
|---|---|---|
| | 0.995 | 90.0 |
| | 1.029 | 56.0 |
| | 1.023 | 58.6 |
| | 1.014 | 62.8 |
| | 1.037 | 51.2 |
| | 1.019 | 59.1 |

The molecular structures were analyzed in accordance with density functional theory (DFT). The functional and the basis function used for calculations of the dihedral angles were B3LYP and 6-31G*, respectively. Natural bonding orbital (NBO) analysis was conducted for the bond orders, and Wiberg bond indices were used.

Accordingly, the host material is preferably a host material having a structure in which the number of benzene rings that are linearly fused is up to two, such as benzene, naphthalene, fluorene, benzofluorene, phenanthrene, chrysene, triphenylene, pyrene, fluoranthene, or benzofluoranthene. The use of such a host material provides an element with high durability because the above structure is resistant to bond dissociation caused by the exciton energy when electric charges are recombined. This effect is greater in the second light-emitting layer and the third light-emitting layer, which are a layer that emits blue light and a layer that emits green light, respectively, because the excitation energy is larger in these layers. The high stability to the host material provides a higher effect when the host material is used in the first to third light-emitting layers in common.

The most material described above may have, as a substituent, an alkyl group having 1 to 12 carbon atoms. Specific examples of such an alkyl group include a methyl group, an ethyl group, a n-propyl group, an iso-propyl group, a n-butyl group, an iso-butyl group, a sec-butyl group, a tert-butyl group, a n-pentyl group, an iso-pentyl group, a neopentyl group, a tert-pentyl group, a hexyl group, a heptyl group, and an octyl group.

(12) The organic EL element includes a hole blocking layer adjacent to the third light-emitting layer on the cathode side, and a material constituting the hole blocking layer consists of a hydrocarbon.

The organic EL element according to this embodiment may include a hole blocking layer between the light-emitting layer and the cathode. Since the hole blocking layer has a function of blocking the transfer of holes about to pass through the light-emitting layer, holes are accumulated at the interface between the light-emitting layer and the hole blocking layer. That is, the hole blocking layer preferably has a molecular structure capable of withstanding generation of excessive radical cations, and the hole blocking layer is preferably a hole blocking layer consisting of a hydrocarbon having high chemical stability.

In general, compounds having a heteroatom, such as a nitrogen atom, an oxygen atom, or a sulfur atom, have an unshared electron pair and thus are active for donation and acceptance of electrons, that is, oxidation and reduction. Therefore, unpaired electrons generated through the donation and acceptance of electrons may cause an interaction such as a disproportionation reaction, resulting in deterioration of the material. Accordingly, such compounds have low chemical stability. In contrast, compounds consisting of hydrocarbons are preferred because they have no unshared electron pairs and thus have high chemical stability.

(13) The third light-emitting layer has a thickness of 1 nm or more and less than 5 nm.

In the organic EL element according to this embodiment, the third light-emitting layer preferably has a thickness of 1 nm or more and less than 5 nm. This range is preferred because green light emitted from the third light-emitting layer easily contributes to the balance of light emission. A thickness of 1 nm or more is preferred because the luminance of green light emitted from the third light-emitting layer easily contributes to the balance of light emission. A thickness of the third light-emitting layer of less than 5 nm is preferred because the luminance of green light emission is not excessively high compared with those of emission of light of other colors.

In the organic EL element according to this embodiment, since green light is emitted from both the first light-emitting layer and the third light-emitting layer, the thickness of the third light-emitting layer is preferably less than 5 nm, which is smaller than that in the related art.

Specific examples of the light-emitting materials used in the present invention are shown below. These are materials suitable for satisfying the relations of energy levels described above. However, these compounds are mere specific examples, and the present invention is not limited to this.

EM1 to EM31 are specific examples of host materials.

[Chem. 4]

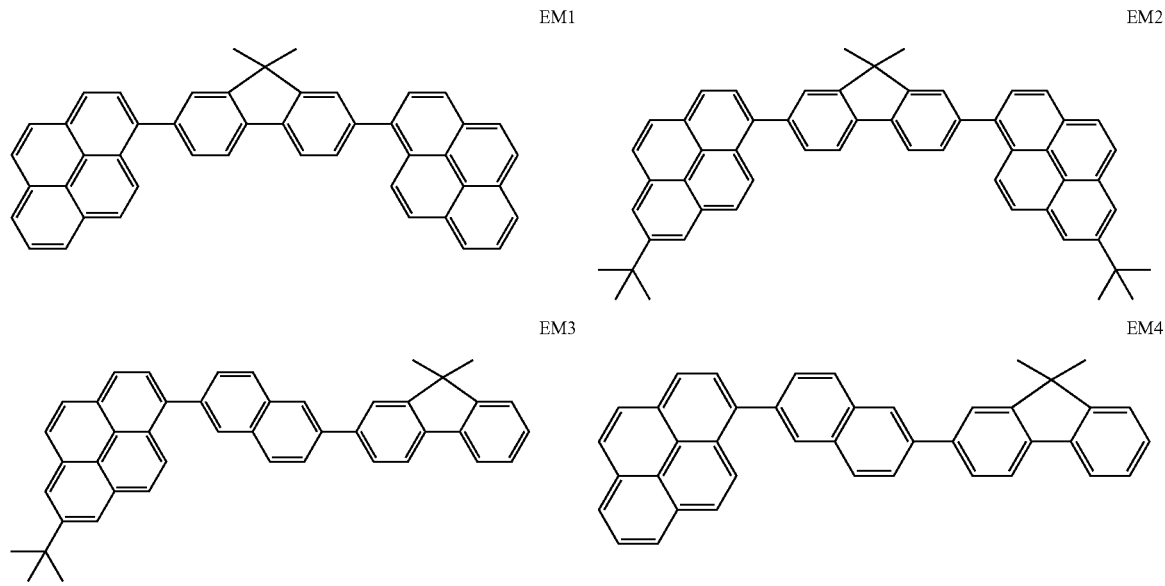

-continued
EM5
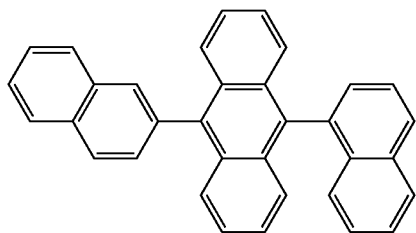
EM6
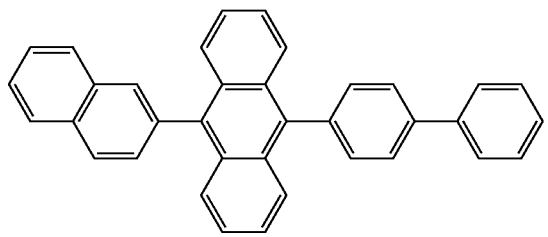
EM7
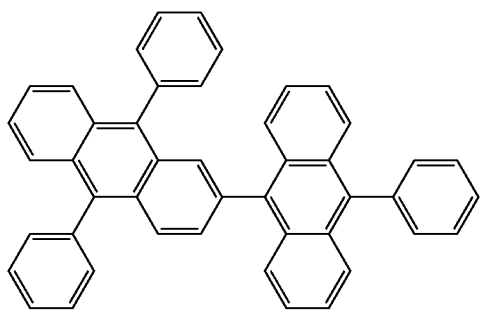
EM8
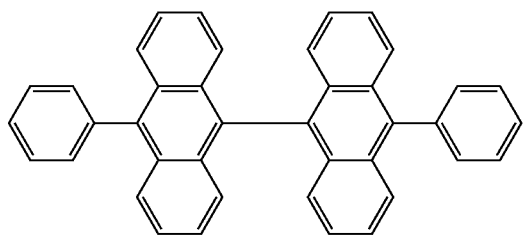
EM9
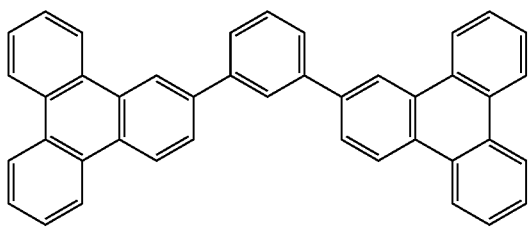
EM10
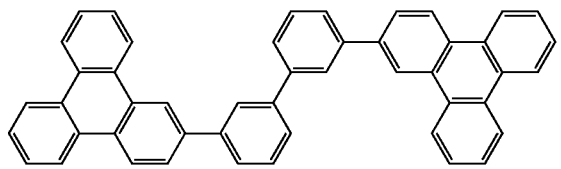
EM11
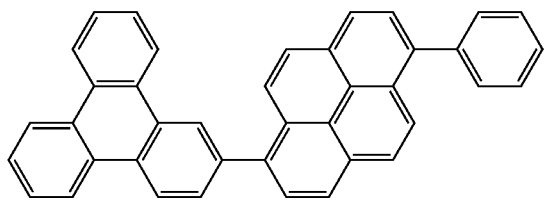
EM12
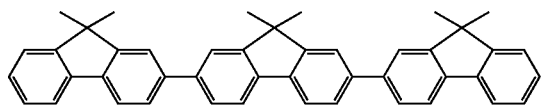
EM13
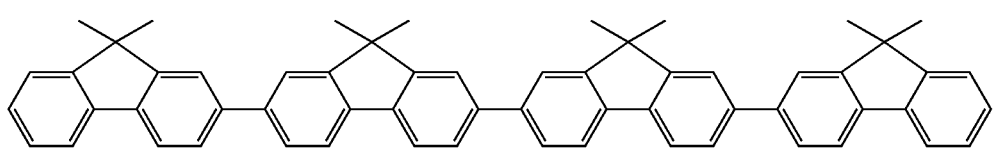
EM14
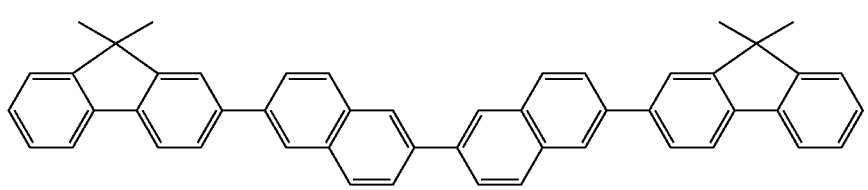

-continued
EM15
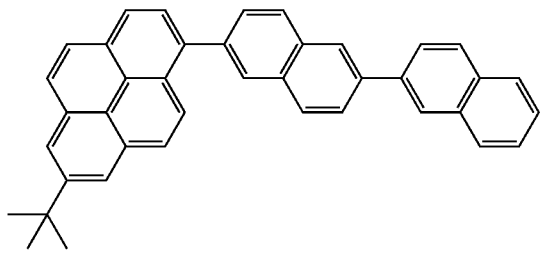
EM16
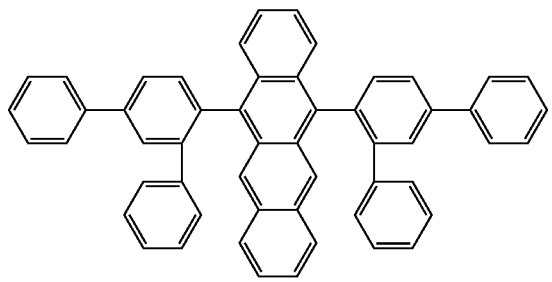
EM17
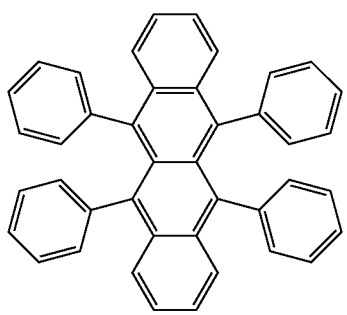
EM18
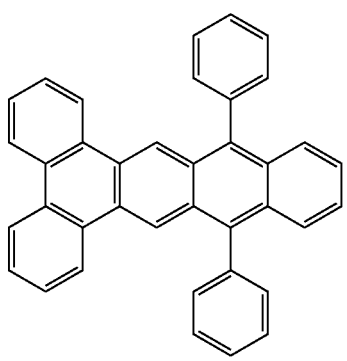
EM19
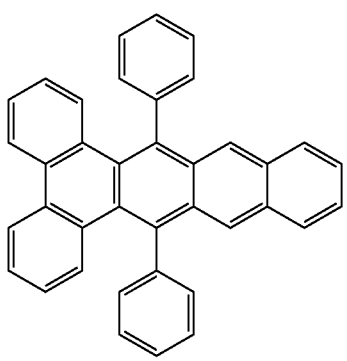
EM20
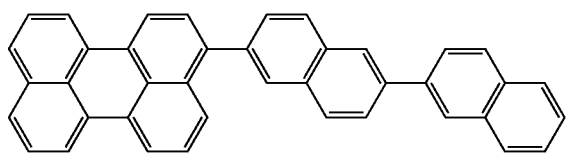
EM21
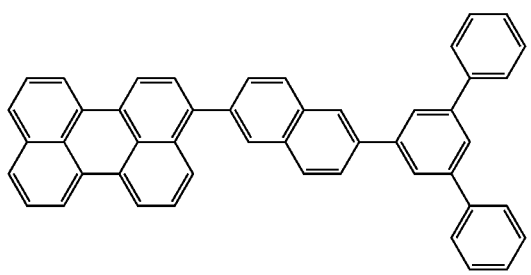
EM22
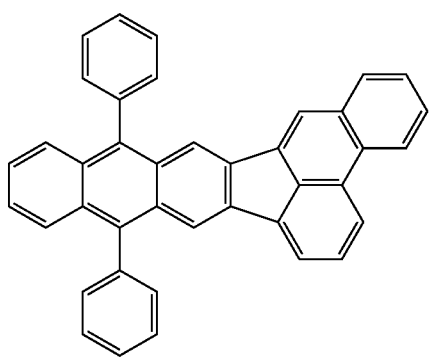

-continued
EM23
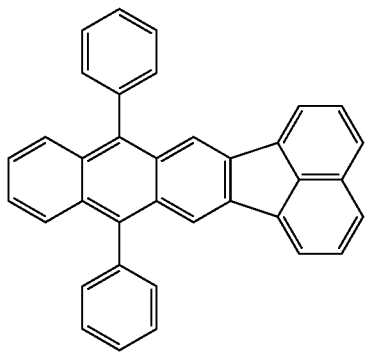
EM24
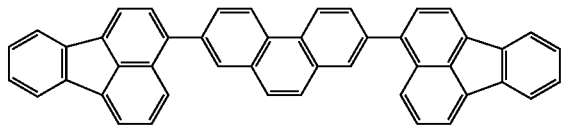
EM25
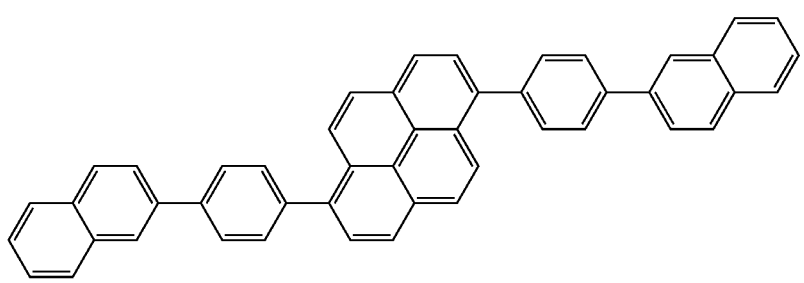
EM26
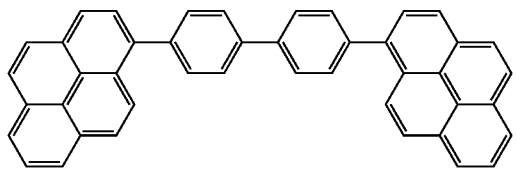
EM27
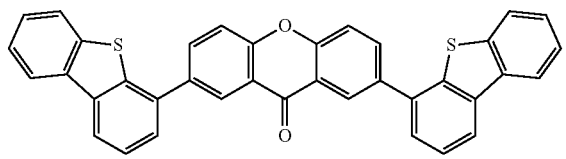
EM28
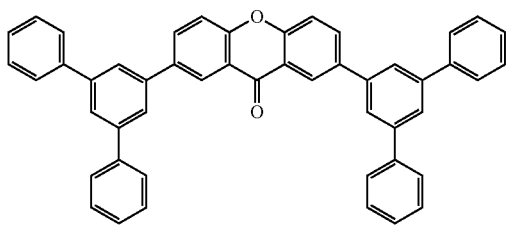
EM29
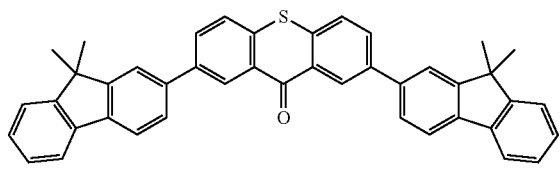
EM30
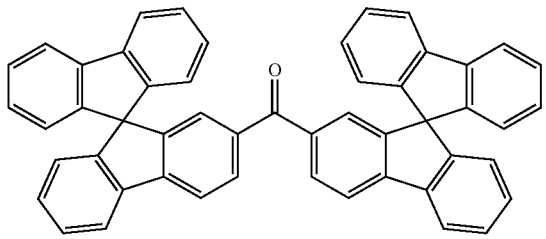
EM31
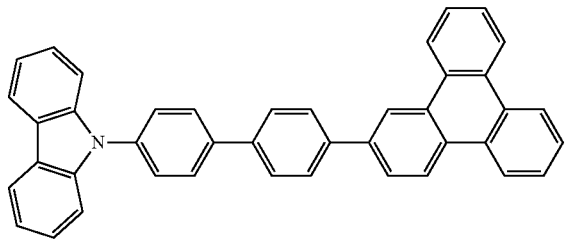

RD1 to RD23 are specific examples of red dopant materials.
[Chem. 5]
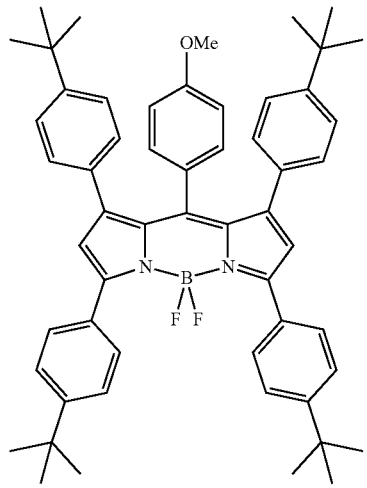
RD1
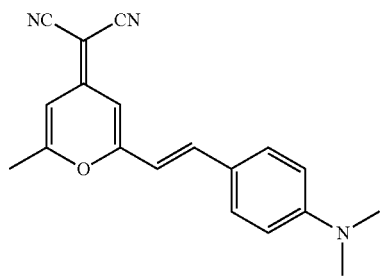
RD2
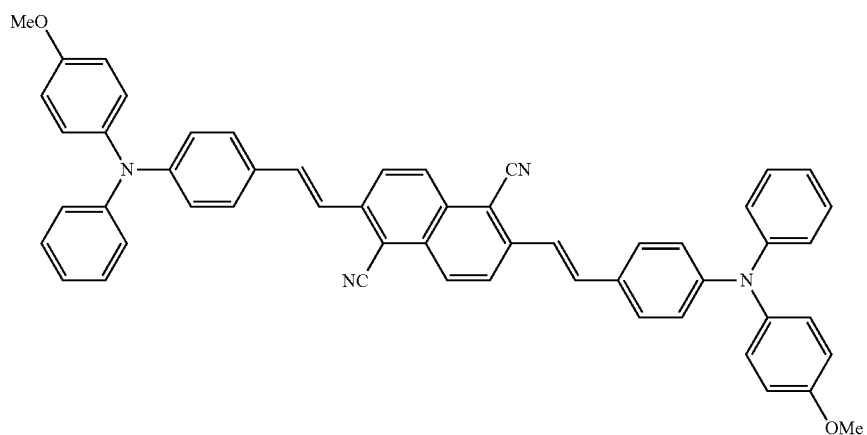
RD3
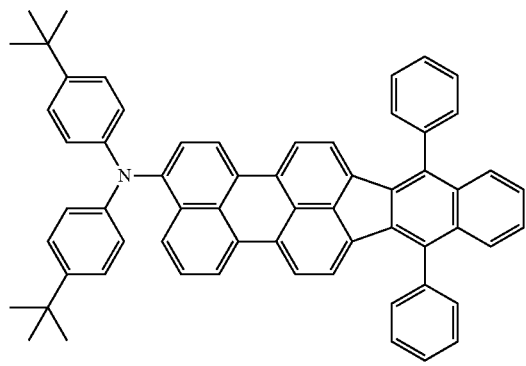
RD4
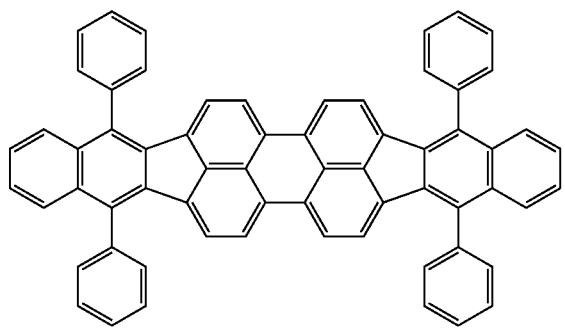
RD5

-continued
RD6
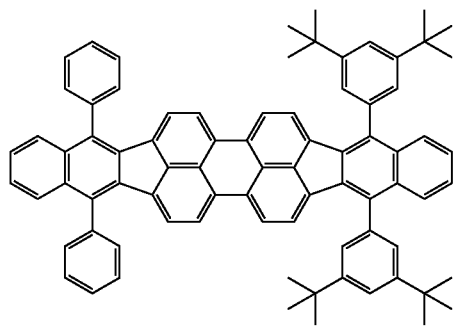
RD7
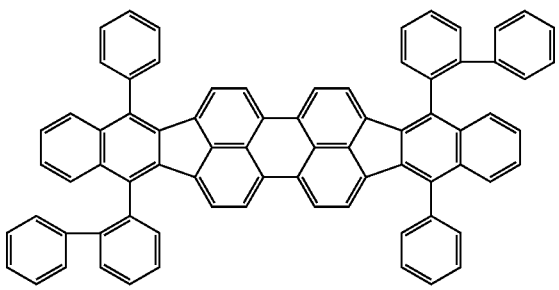
RD8
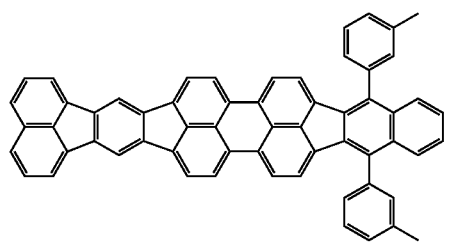
RD9
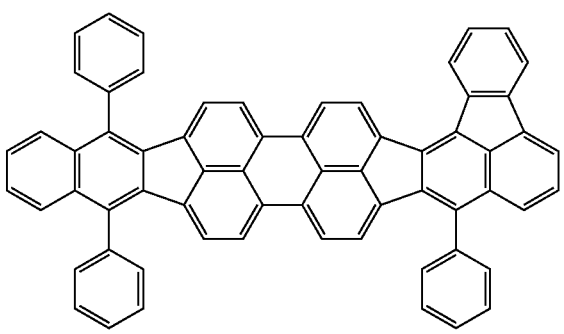
RD10
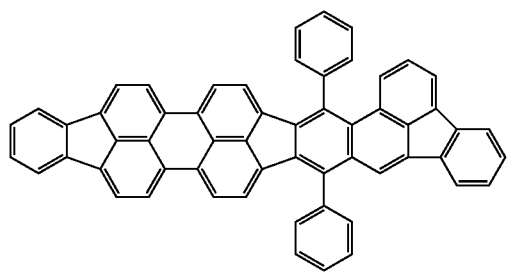
RD11
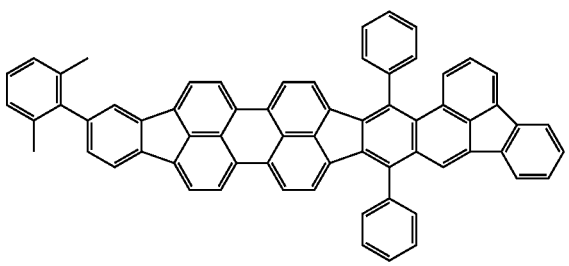
RD12
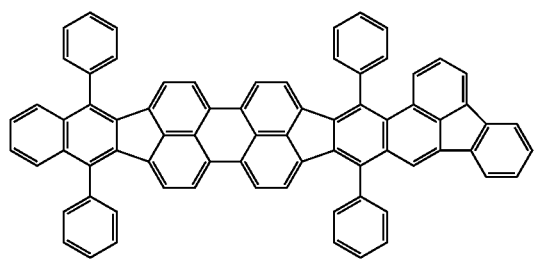
RD13
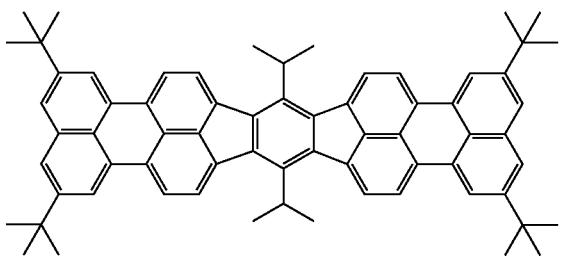
RD14
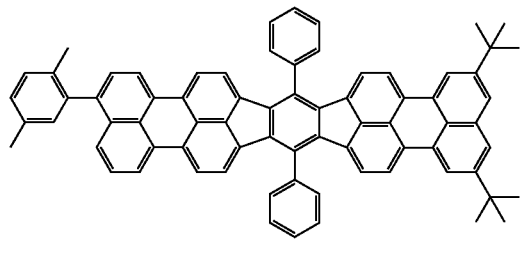
RD15
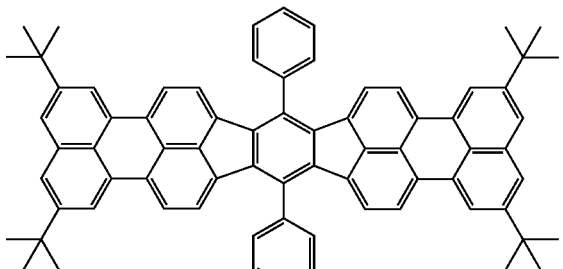

RD16
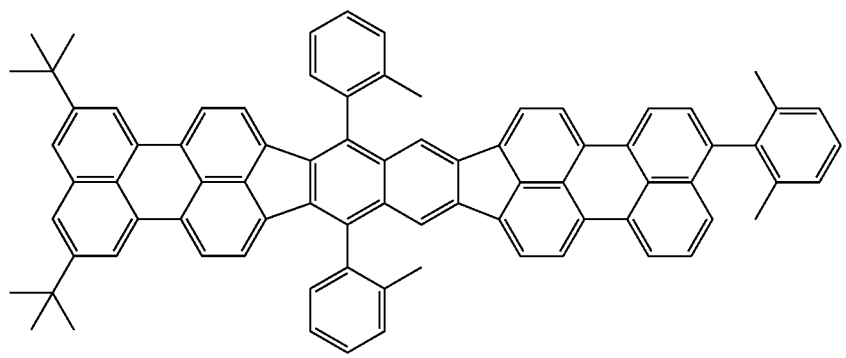
RD17
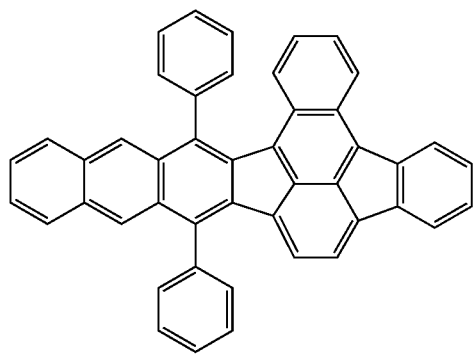
RD18
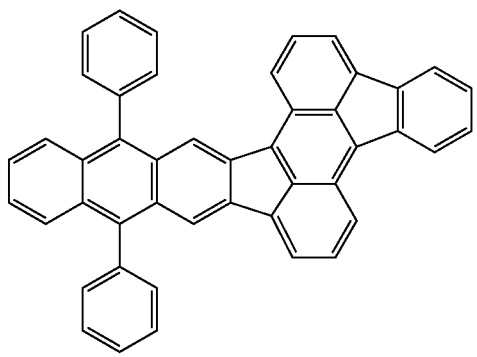
RD19
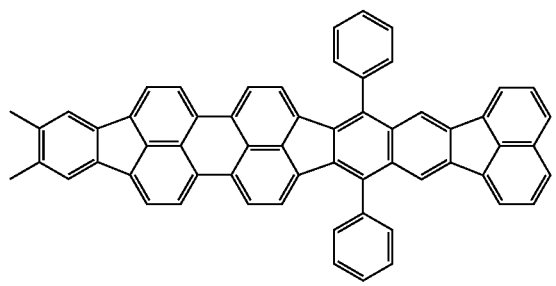
RD20
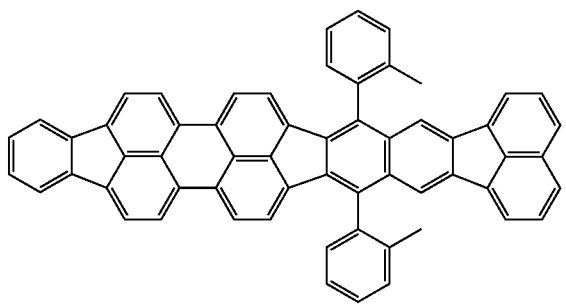
RD21
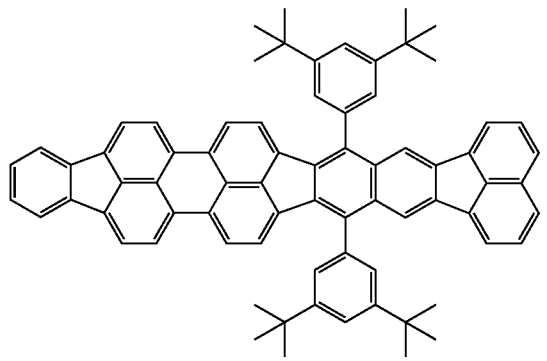
RD22
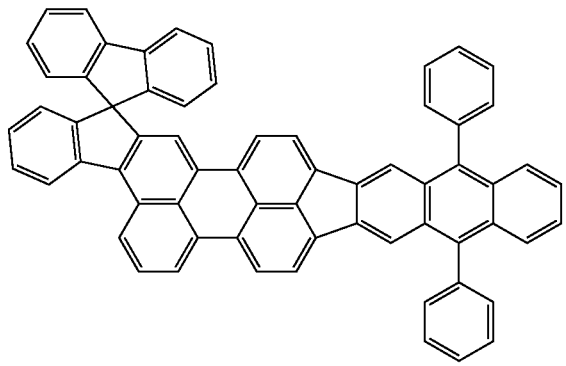

RD23
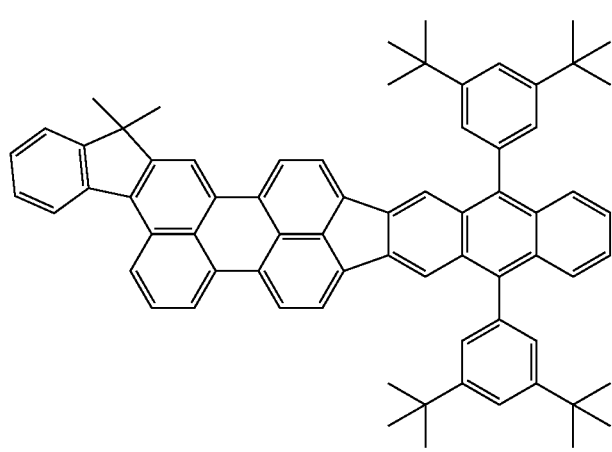
The concentration of the red dopant material is preferably 0.1% by weight or more and 5% by weight or less, and more preferably 0.1% or more and 0.5% by weight or less. These ranges are preferred because the red light emission contributes to the balance of light emission of the organic EL element.
GD1 to GD32 are specific examples of green dopant materials.
[Chem. 6]
GD1
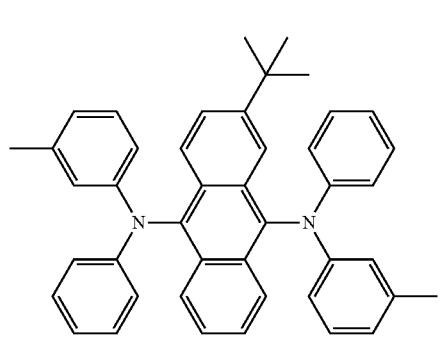
GD2
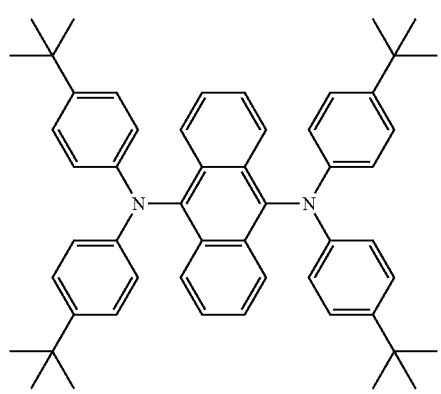
GD3
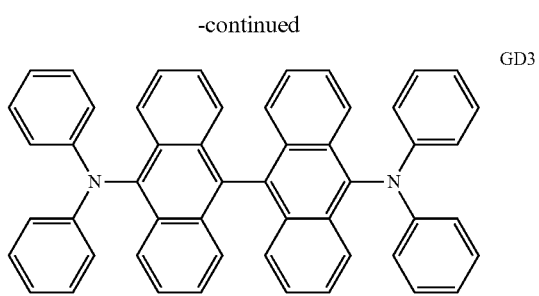
GD4
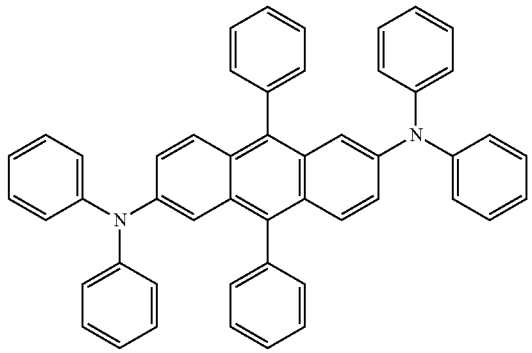
GD5
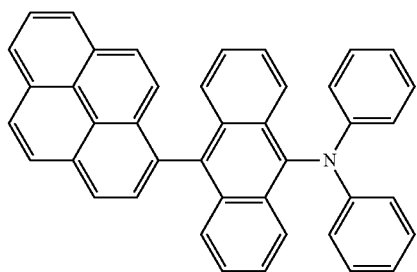

GD6
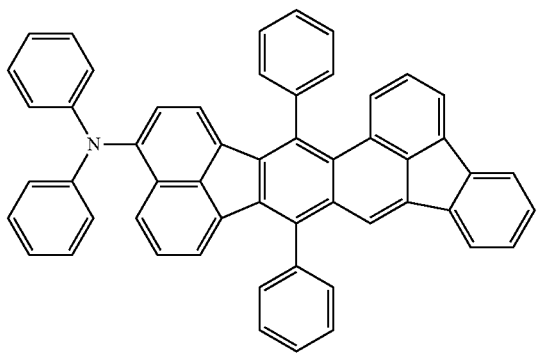
GD7
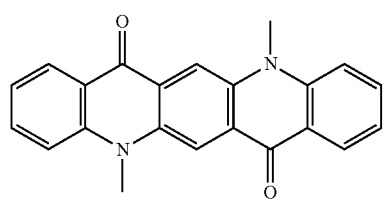
GD8
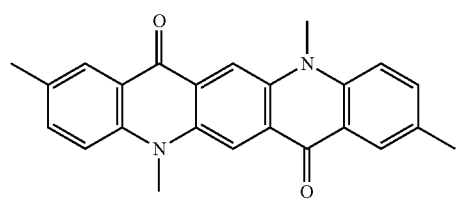
GD9
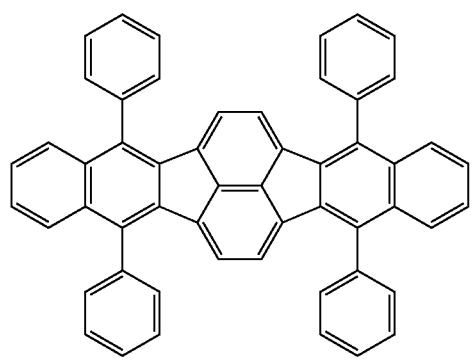
GD10
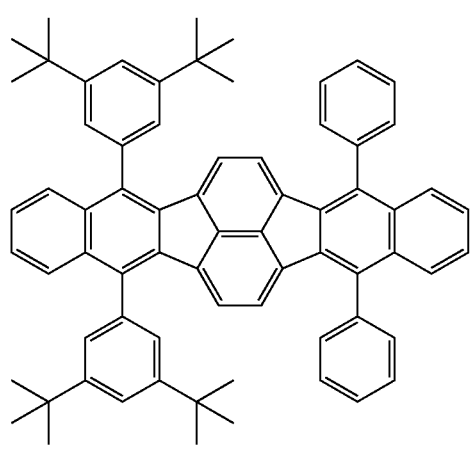
GD11
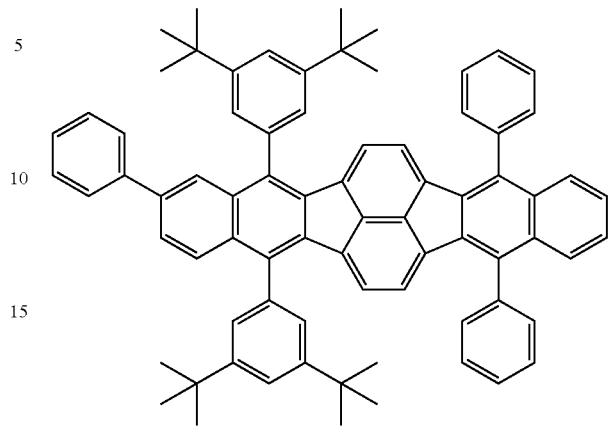
GD12
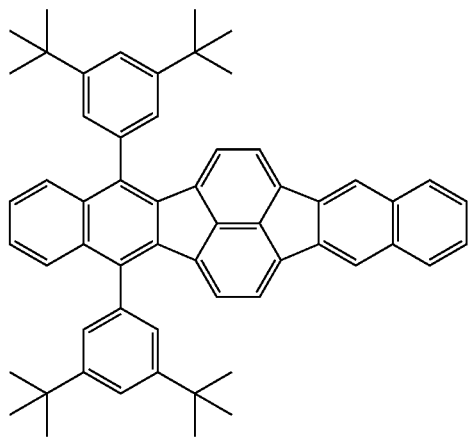
GD13
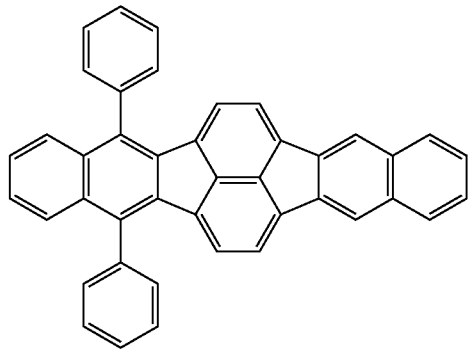

-continued
GD14
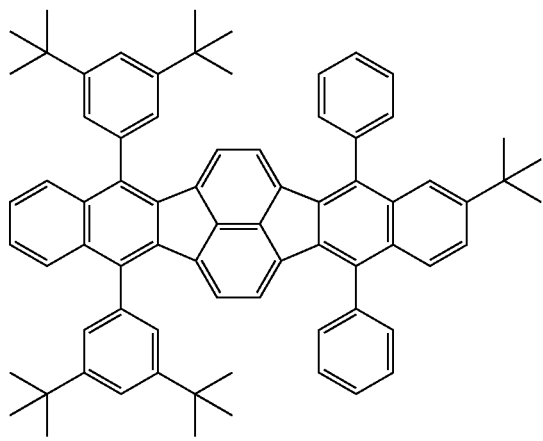
GD15
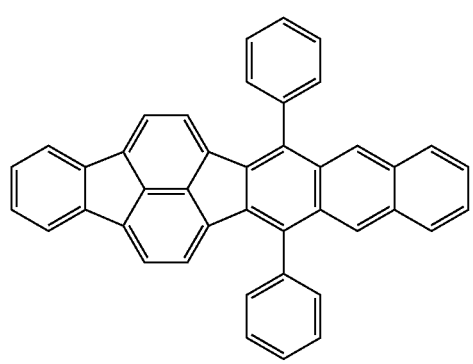
GD16
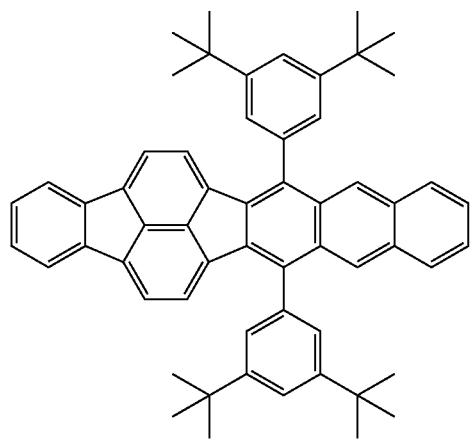
GD17
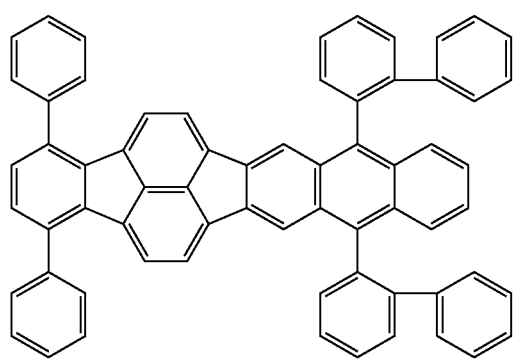
GD18
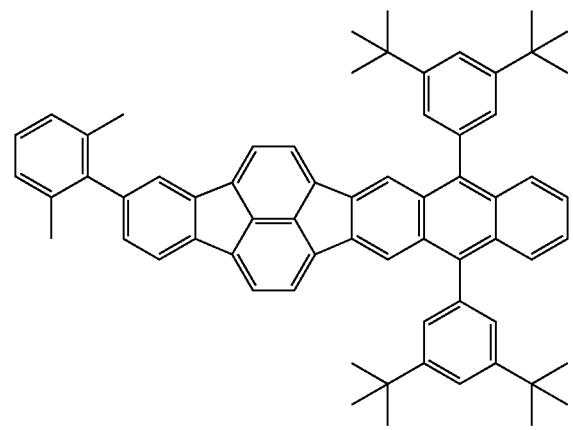
GD19
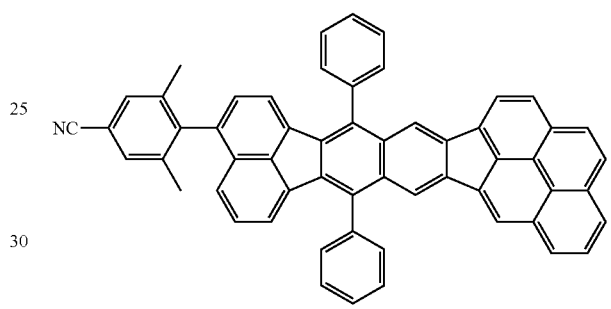
GD20
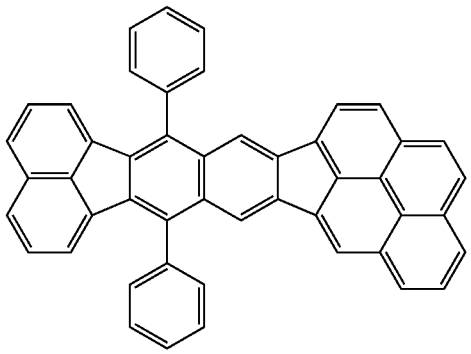
GD21
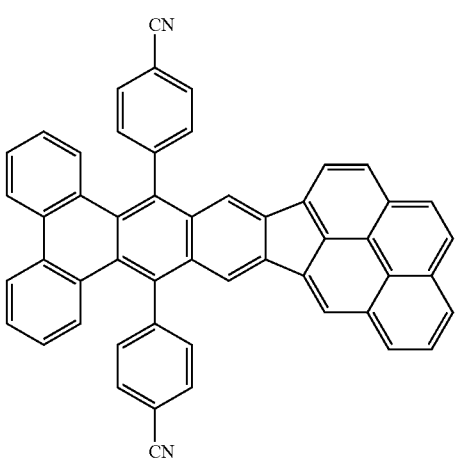

GD22
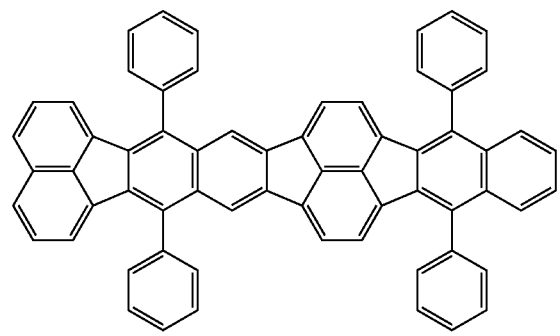
GD23
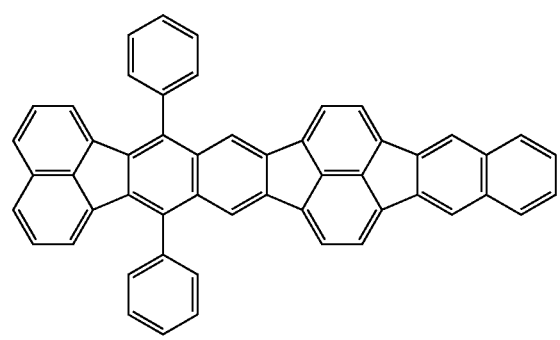
GD24
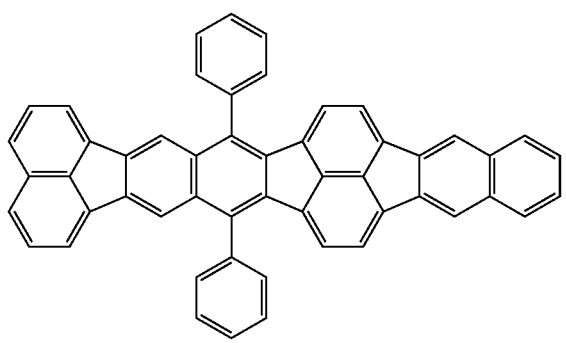
GD25
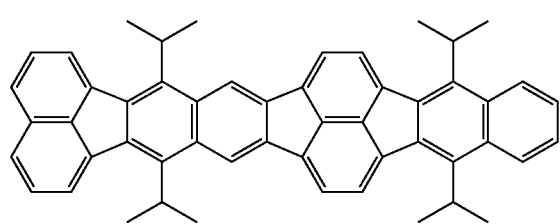
GD26
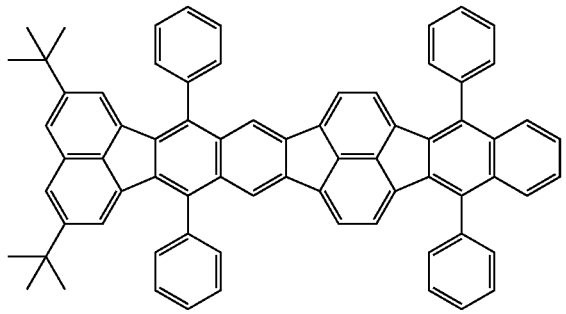
GD27
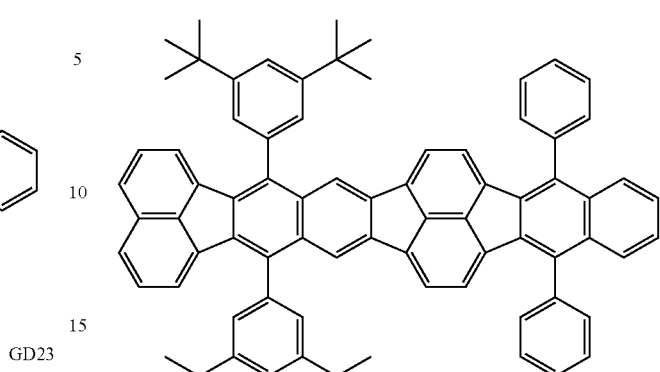
GD28
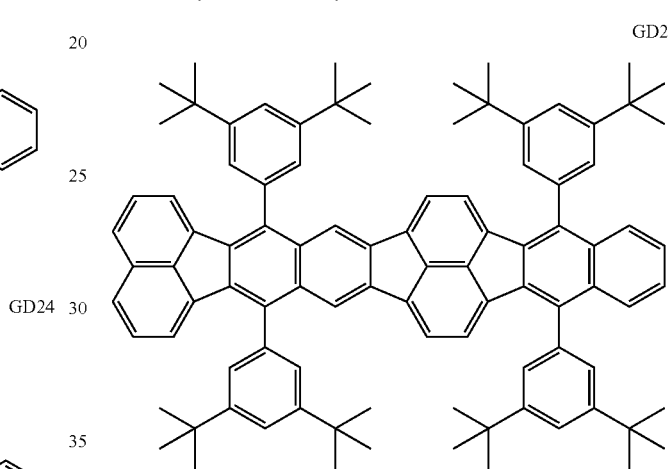
GD29
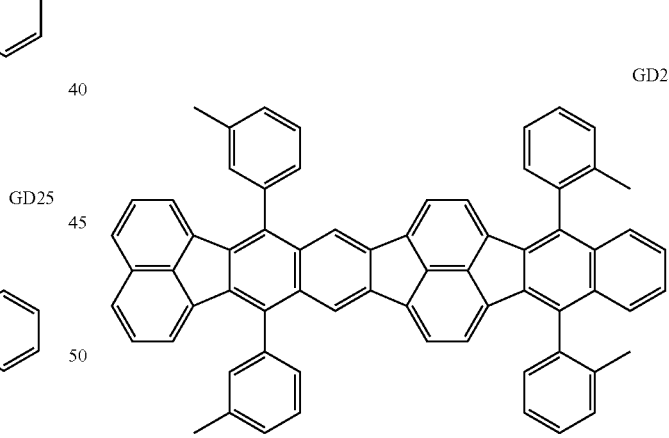
GD30
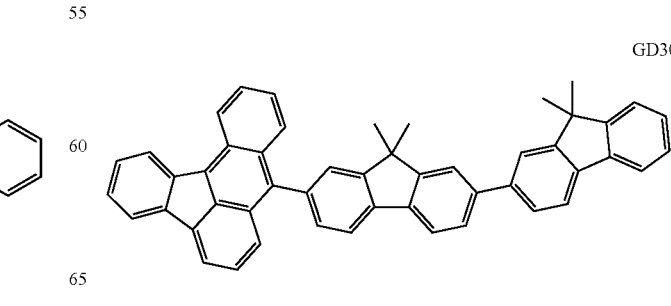

GD31

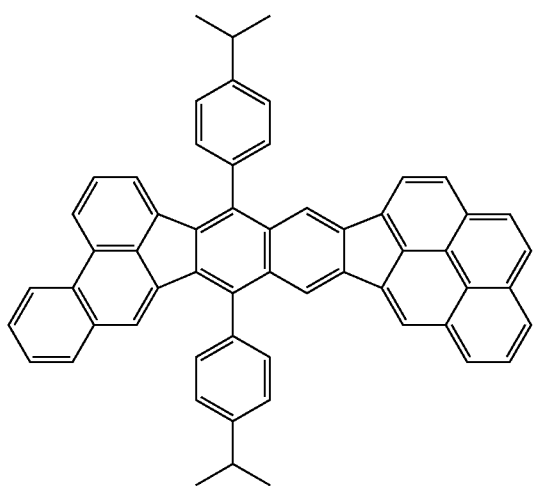

GD32

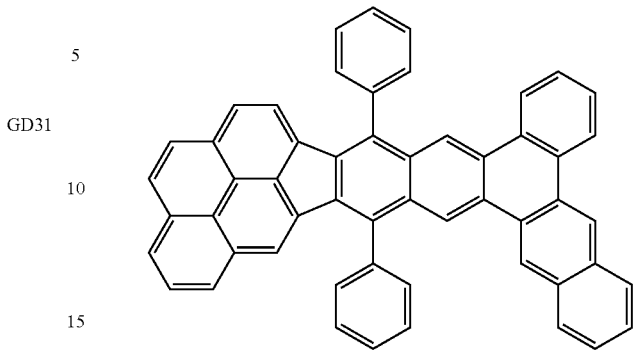

The green-light-emitting dopant material is mixed with the red dopant material and used in the first light-emitting layer, and is also contained in the third light-emitting layer. The concentration of the green-light-emitting dopant material used in the first light-emitting layer is preferably 0.1% by weight or more and 10% by weight or less, and more preferably 1% by weight or more and 5% by weight or less. The concentration of the green-light-emitting dopant material used in the third light-emitting layer is preferably 0.1% by weight or more and 5% by weight or less, and more preferably 0.1% by weight or more and 1% or less. These ranges are preferred because the green light emission contributes to the balance of light emission of the organic EL element.

BD1 to BD31 are specific examples of blue-light-emitting dopant materials.

[Chem. 7]

BD1

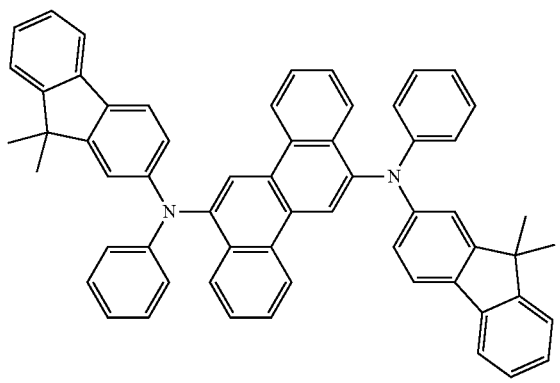

BD2

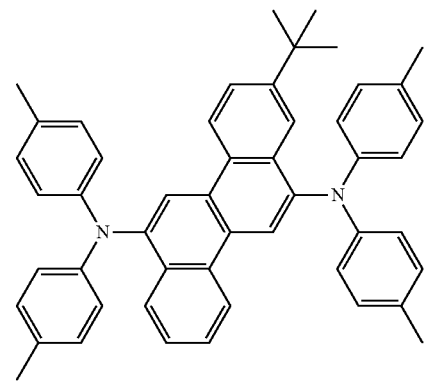

BD3

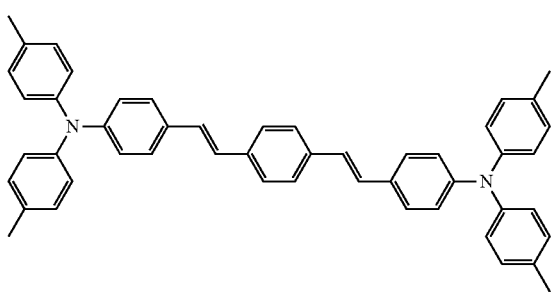

BD4

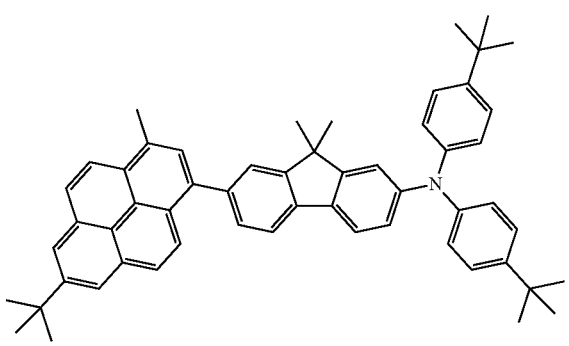

-continued
BD5
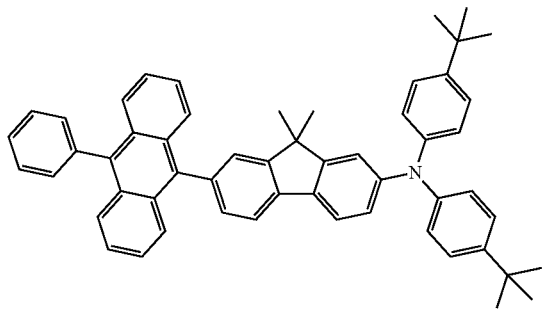
BD6
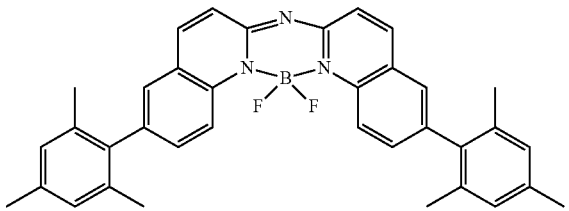
BD7
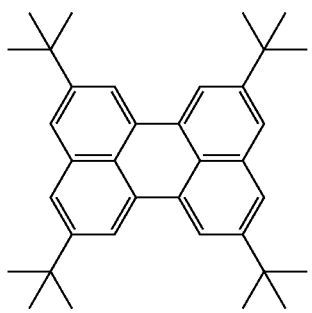
BD8
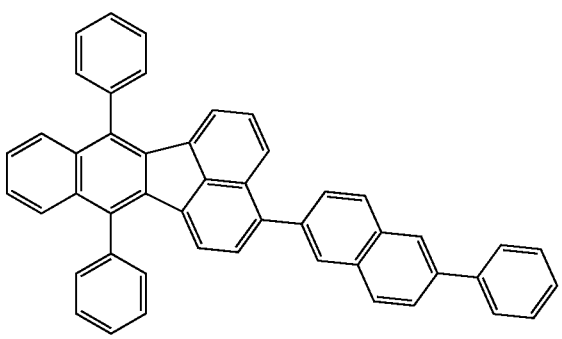
BD9
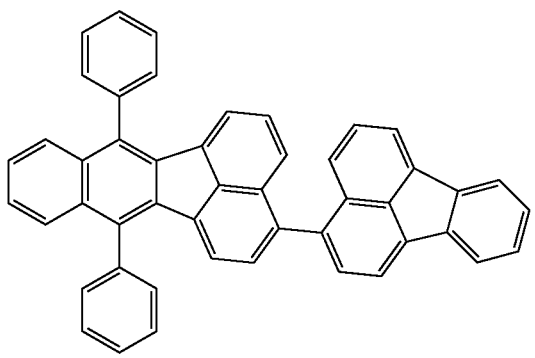
BD10
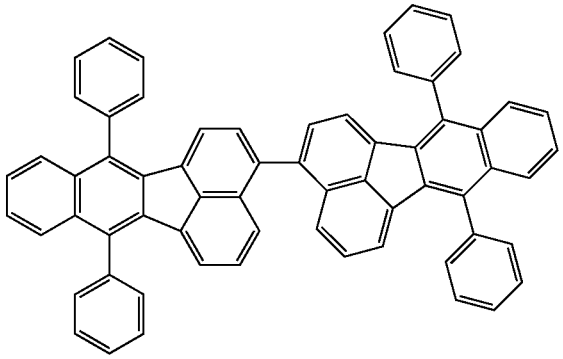
BD11
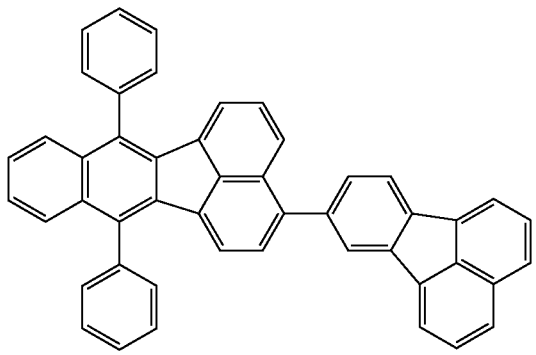
BD12
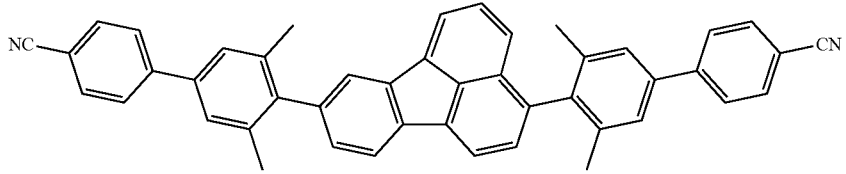

-continued
BD13
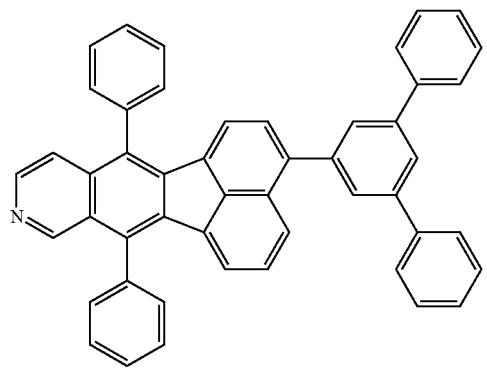
BD14
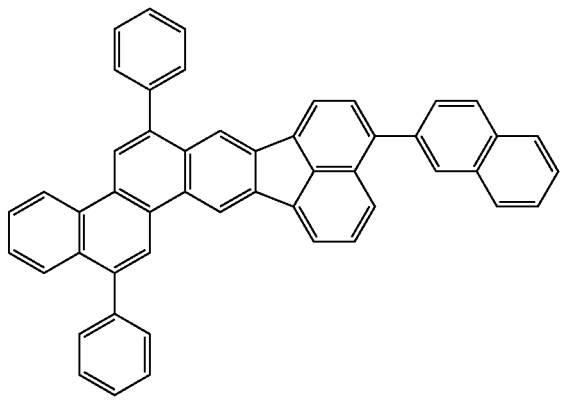
BD15
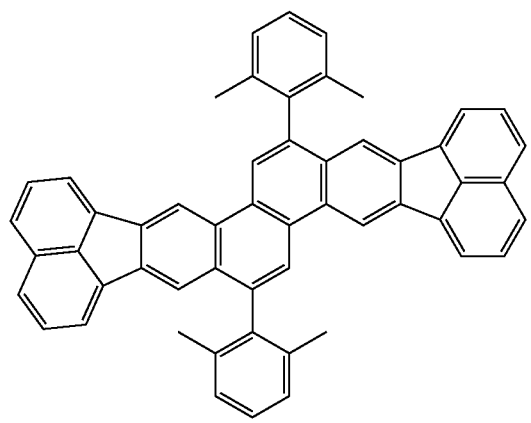
BD16
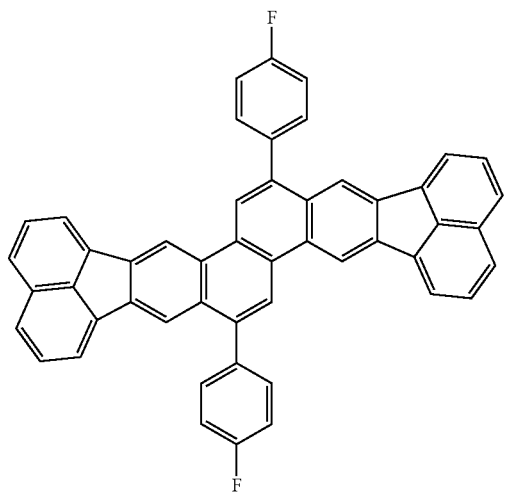
BD17
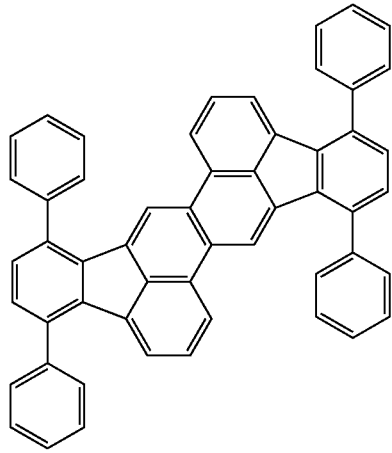
BD18
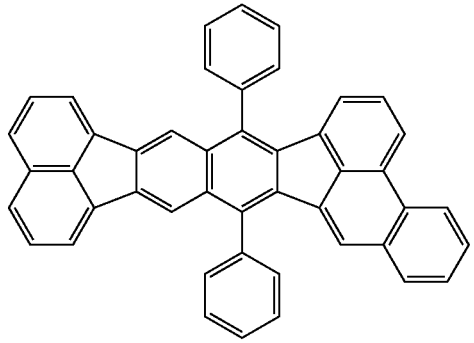

-continued
BD19
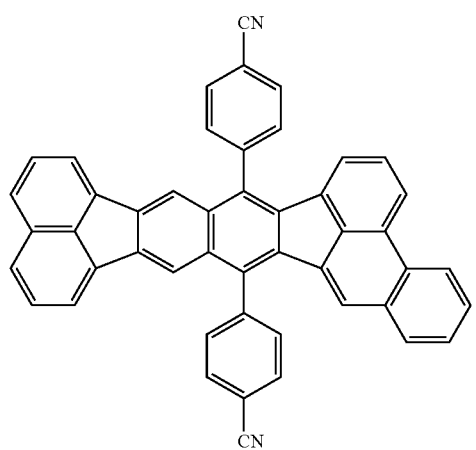
BD20
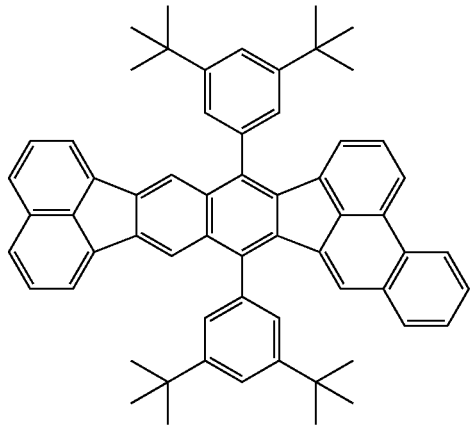
BD21
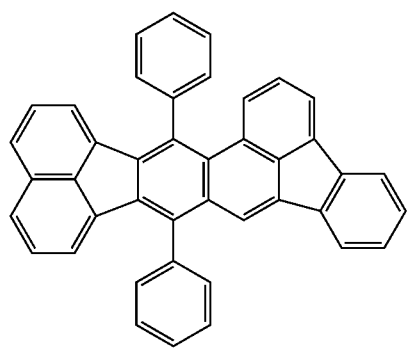
BD22
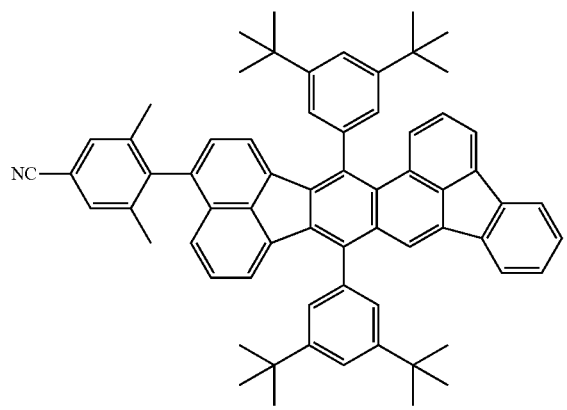
BD23
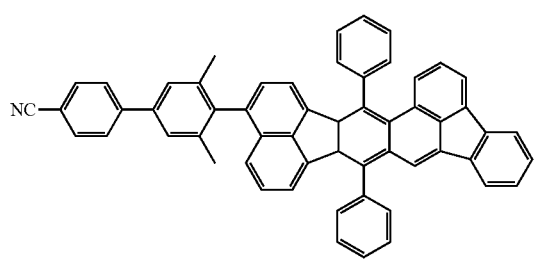
BD24
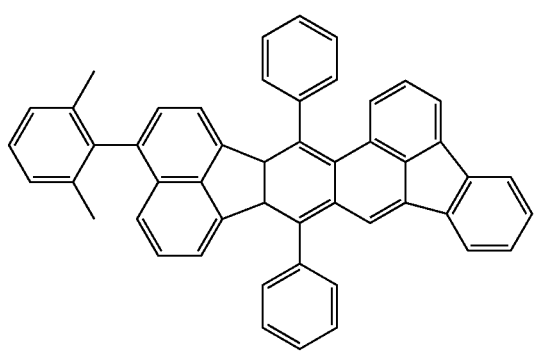

-continued
BD25
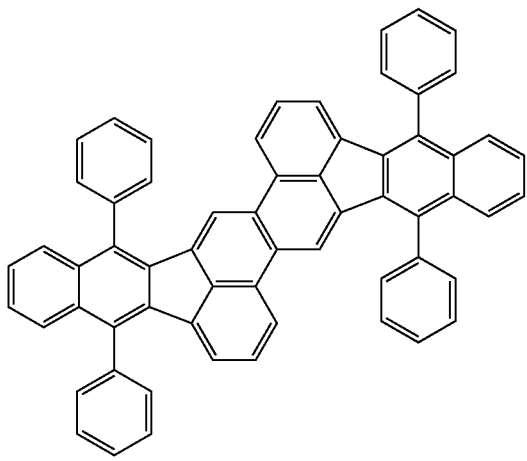
BD26
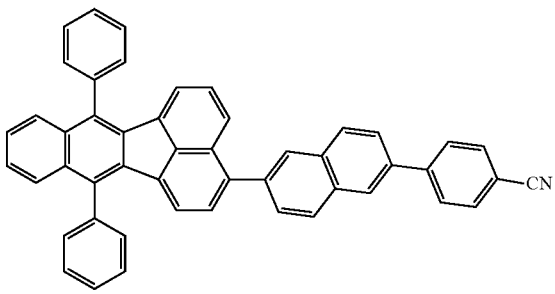
BD27
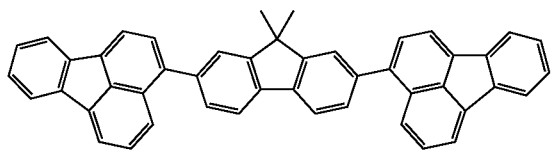
BD28
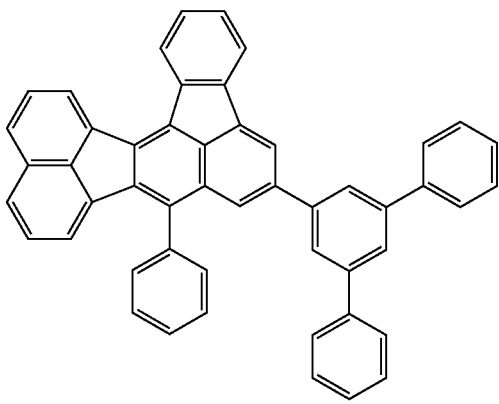
BD29
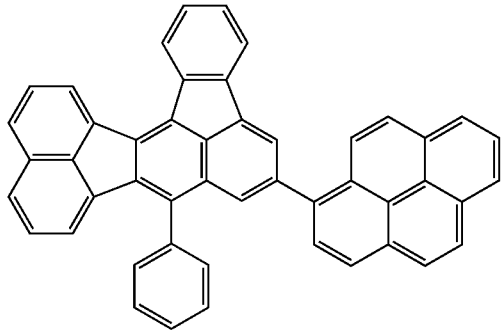
BD30
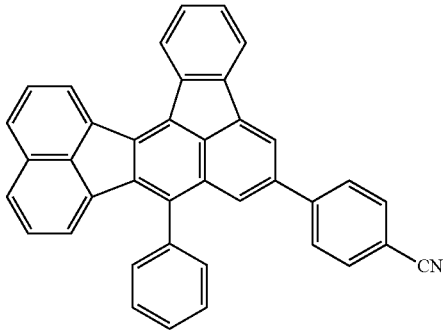
BD31
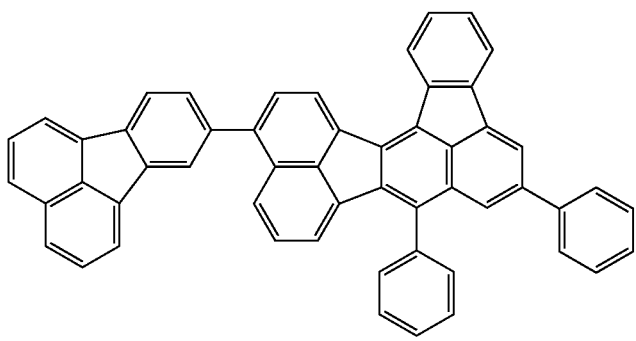

Preferably, the blue-light-emitting dopant material does not have a substituted amino group, which has strong electron-donating properties. The blue-light-emitting dopant material is preferably a compound having a cyano group, which has strong electron-withdrawing properties. The structure that does not have a substituted amino group but has a cyano group can deepen the LUMO energy of the dopant material.

The concentration of the blue dopant material is preferably 0.1% by weight or more and 5% by weight or less, and more preferably 0.1% by weight or more and 1% by weight or less. These ranges are preferred because the blue light emission easily contributes to the balance of light emission of the organic EL element.

(Other Configurations of Organic EL Element According to the Embodiment)

(Substrate)

The substrate of the organic EL element according to this embodiment may be a Si substrate, a glass substrate, or a resin substrate. In the case of a Si substrate, a micro-display apparatus can also be provided by forming transistors in the Si itself. In the case of a glass substrate, a display apparatus may be produced by providing TFTs. A resin substrate may also be referred to as a flexible substrate. In the case of a flexible substrate, a foldable or rollable display apparatus may be provided. The substrate may transmit light or may not transmit light as long as the substrate does not block the emission direction of the light-emitting device.

(Electrode)

In the organic EL element according to this embodiment, the anode may be a reflective electrode, and the cathode may be a transmissive electrode. Alternatively, both the anode and the cathode may be transmissive electrodes, or the anode may be a transmissive electrode, and the cathode may be a reflective electrode.

The reflective electrode of the organic EL element according to this embodiment is preferably made of a metal material having a reflectance of 80% or more. Specifically, a metal such as Al or Ag or an alloy obtained by adding Si, Cu, Ni, Nd, Ti, or the like to such a metal can be used. For example, AgMg, AlCu, or TiN can be used as the alloy. The term reflectance refers to a reflectance at a wavelength of light emitted from the light-emitting layer. The reflective electrode may have a barrier layer on the surface on the light extraction side thereof. The material of the barrier layer is preferably a metal such as Ti, W, Mo, or Au or an alloy thereof. The alloy may include any of the alloys mentioned above.

The transmissive electrode of the organic EL element according to this embodiment may be a semi-transmissive reflective layer having a property of transmitting a portion of light that has reached a surface thereof and reflecting another portion of the light (i.e., semi-transmissive reflectivity). The cathode is formed of, for example, an elemental metal such as magnesium or silver, an alloy containing magnesium or silver as a main component, or an alloy material containing an alkali metal or an alkaline earth metal.

When the cathode is made of an alloy, the alloy may be, for example, an alloy of magnesium and silver. In the case of an alloy of magnesium and silver, the ratio of magnesium to silver in the alloy may be 1:1, or either atomic percent may be higher than the other. When either atomic percent is made higher than the other atomic percent, the atomic percent of silver may be higher. Such an alloy having a higher silver atomic percent is preferred because the alloy has a high transmittance. Alternatively, when either atomic percent is made higher than the other atomic percent, the atomic percent of magnesium may be higher. Such an alloy having a higher magnesium atomic percent is preferred because the resulting film has good film properties and is unlikely to be cut.

The transmissive electrode may have a multilayered configuration as long as the electrode has a preferred transmittance.

The electrodes of the organic EL element according to this embodiment can be formed by, for example, a sputtering method or a vacuum vapor deposition method.

(Organic Compound Layer)

The organic EL element according to this embodiment may include, for example, a hole injection layer, a hole transport layer, an electron blocking layer, a hole blocking layer, an electron transport layer, and an electron injection layer besides the light-emitting layers. The number of any of such layers provided in the element may be two or more. Any of such layers may be omitted. Although the above layers are described as examples of organic compound layers, these layers may be composed of inorganic compounds.

The organic EL element may have various layer configurations. For example, an insulating layer may be disposed at an interface between an electrode and an organic compound layer, an adhesion layer or an interference layer may be disposed, or the electron transport layer or the hole transport layer may be formed of two layers having different ionization potentials.

An organic compound layer according to this embodiment may be formed as a common layer of a plurality of organic light-emitting elements. The common layer refers to a layer disposed to extend over a plurality of organic light-emitting elements. Such a common layer can be formed by performing a coating process such as spin coating or a vapor deposition process over the entire surface of the substrate.

Examples of these materials will be described below. The material used as the hole transport layer is preferably a material capable of facilitating injection of holes from the anode or a material having a high hole mobility so that the injected holes can be transported to the light-emitting layer. The hole injection layer and the electron blocking layer can also be formed by using similar materials.

To reduce deterioration of the film quality, such as crystallization, in the organic EL element, a material having a high glass transition temperature is preferred. Examples of a low-molecular-weight or high-molecular-weight material having a high hole mobility include triarylamine derivatives, aryl carbazole derivatives, phenylenediamine derivatives, stilbene derivatives, phthalocyanine derivatives, porphyrin derivatives, poly(vinylcarbazole), poly(thiophene), and other electrically conductive polymers.

HT1 to HT19 are specific examples of the material used as the hole transport layer 3; however, the material is not limited to these.

[Chem. 8]
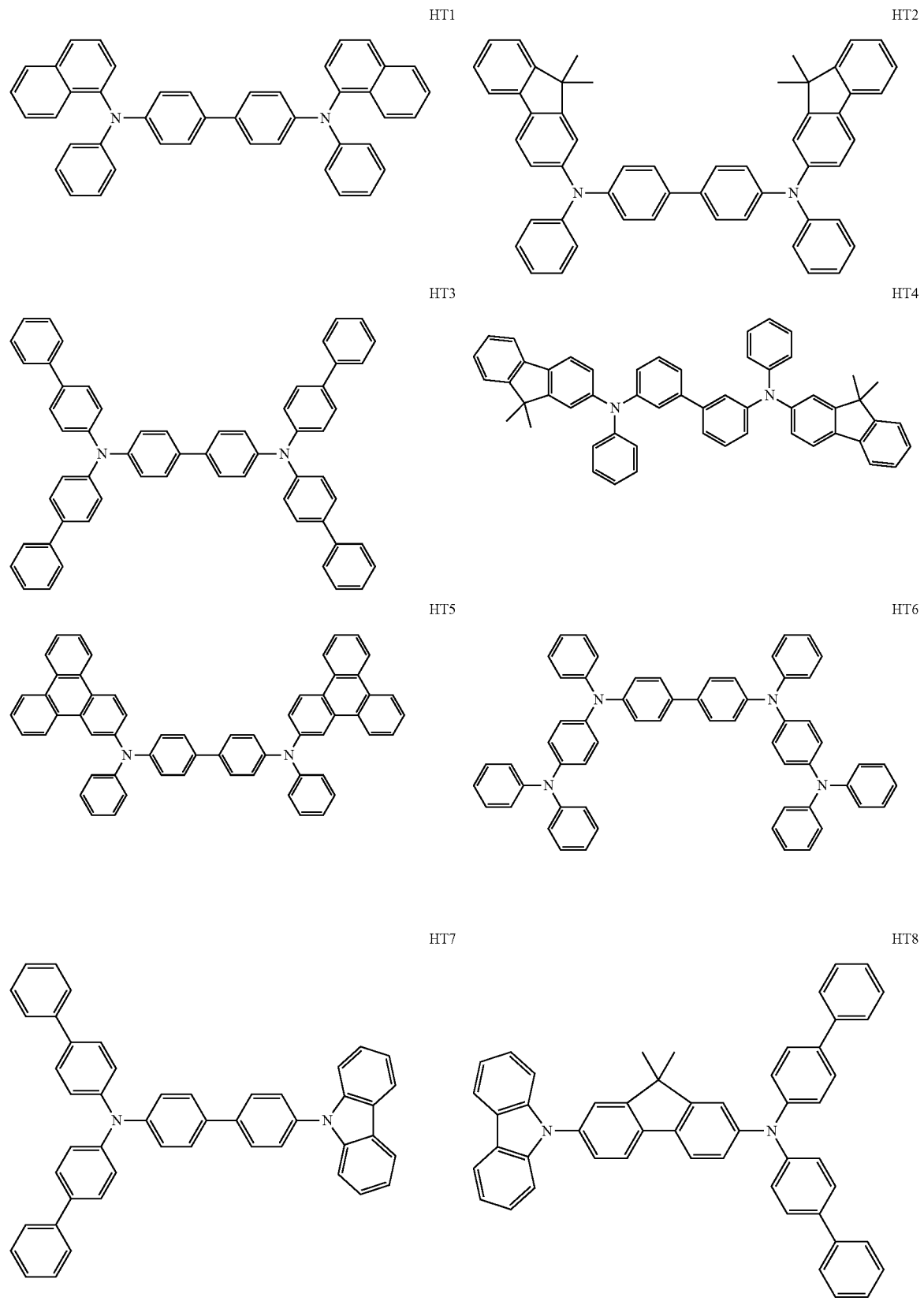

-continued
HT9
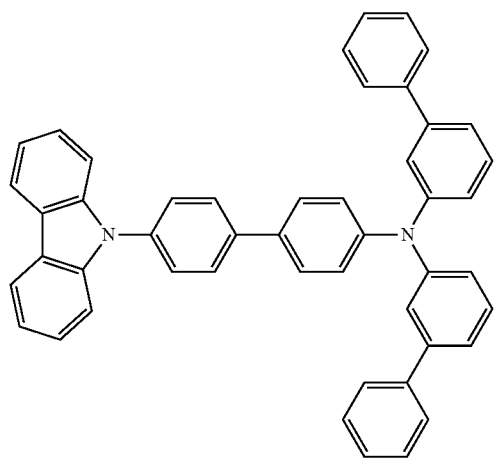
HT10
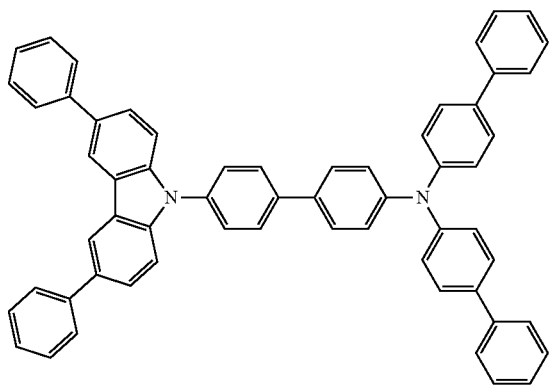
HT11
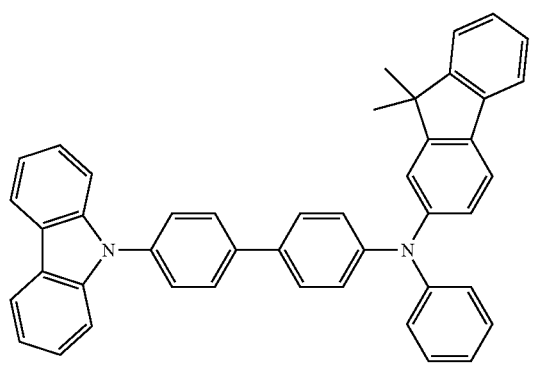
HT12
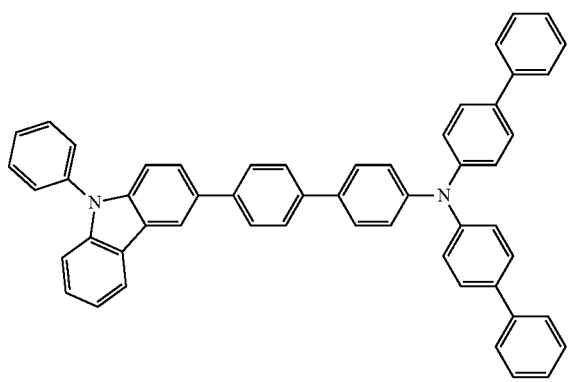
HT13
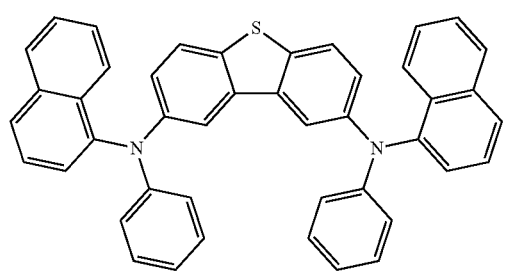
HT14
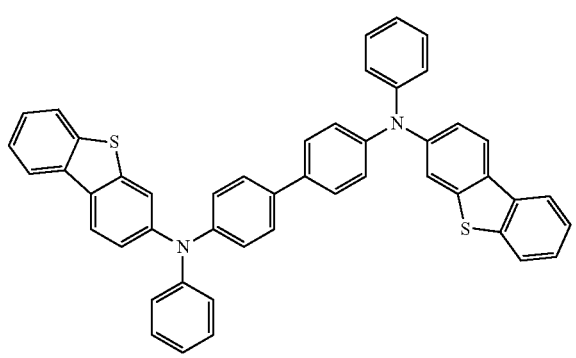

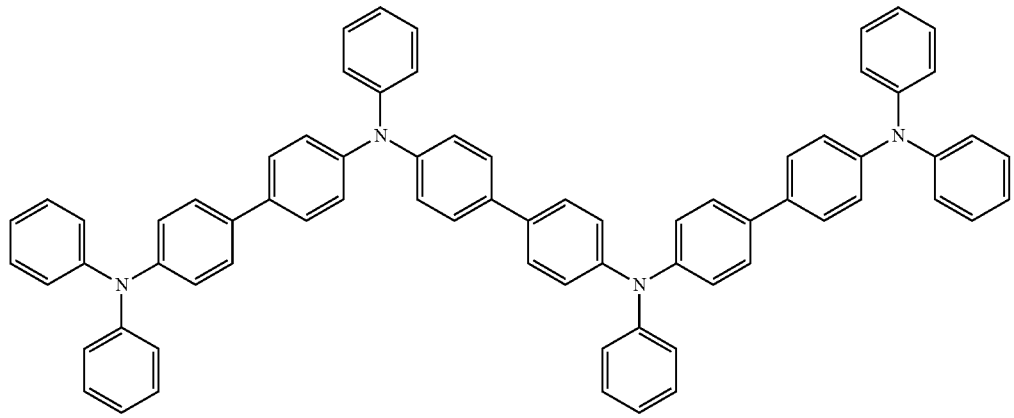
HT15

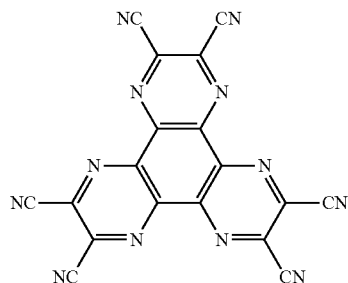
HT16

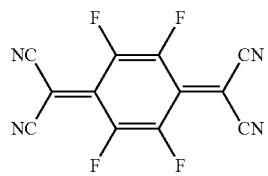
HT17

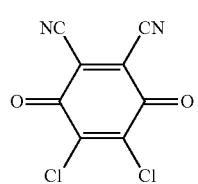
HT18

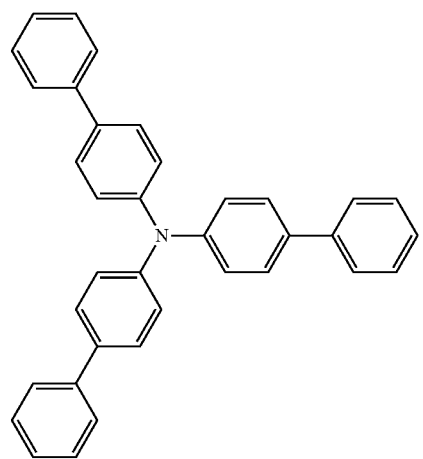
HT19

As the hole injection layer, a compound having a deep LUMO, such as a hexaazatriphenylene compound, a tetrafluoroquinodimethane compound, or a dichlorodicyanobenzoquinone compound is preferably used. Specific examples thereof include compounds HT16 to HT19.

The electron blocking layer is preferably formed of HT7, HT8, HT9, HT10, HT11, or HT12 having a carbazole group. Such a compound having a carbazole group has a deep HOMO and can provide a structure in which the HOMO becomes deeper stepwise in the order of the hole transport material, the electron blocking material, and the light-emitting layer. Thus, holes can be injected into the light-emitting layer at a low voltage.

The material used as the electron transport layer can be freely selected from materials capable of transporting electrons injected from the cathode to the light-emitting layer and is selected in consideration of, for example, the balance with the hole mobility of the hole transport material. The hole blocking layer and the electron injection layer can also be formed by using similar materials. Examples of the material having an electron transport performance include oxadiazole derivatives, oxazole derivatives, pyrazine derivatives, triazole derivatives, triazine derivatives, quinoline derivatives, quinoxaline derivatives, phenanthroline derivatives, organoaluminum complexes, and fused ring compounds (such as fluorene derivatives, naphthalene derivatives, chrysene derivatives, and anthracene derivatives). The above electron transport material is also suitably used as the hole blocking layer.

ET1 to ET23 are specific examples of the material used as the electron transport layer 5; however, the material is not limited to these.

[Chem. 9]
ET1
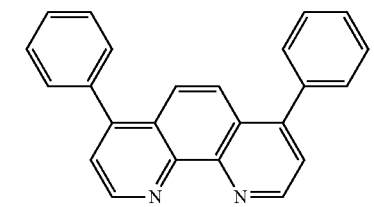
ET2
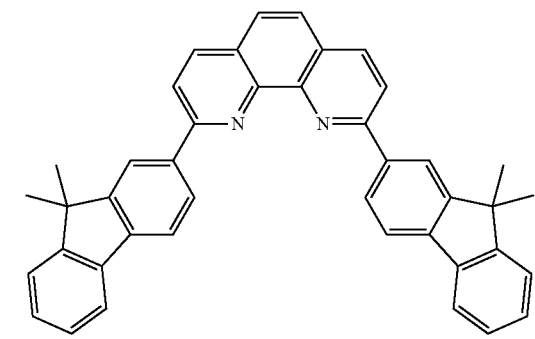
ET3
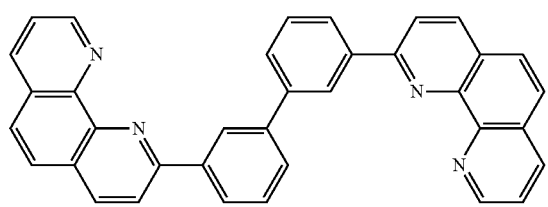
ET4
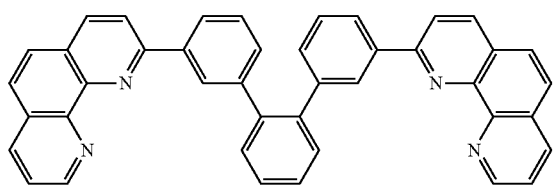
ET5
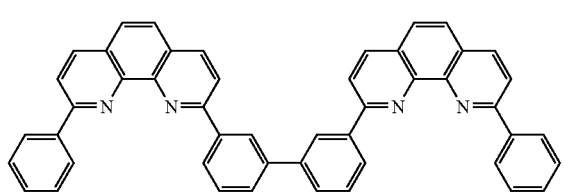
ET6
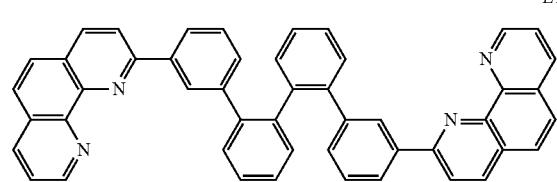
ET7
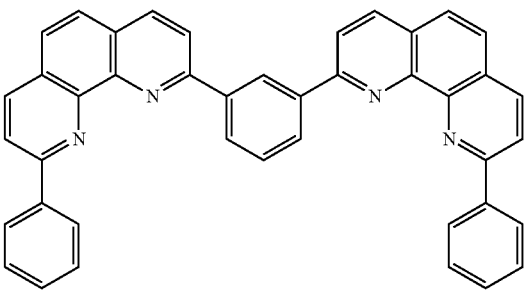
ET8
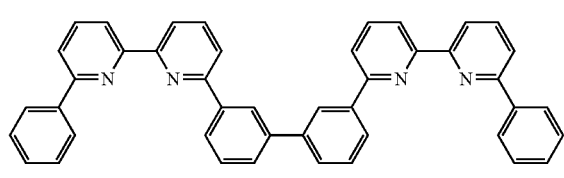
ET9
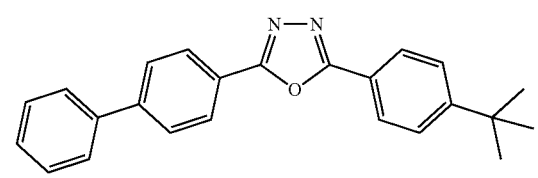
ET10
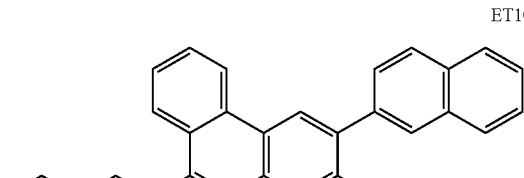
ET11
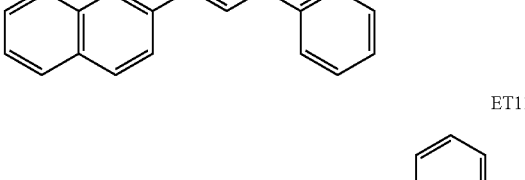
ET12
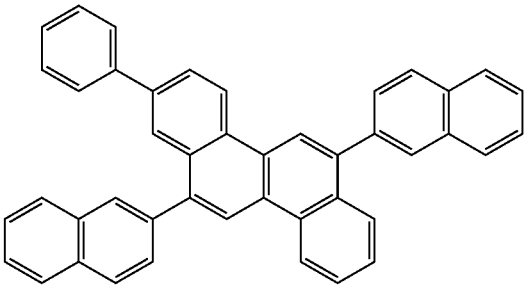

ET13
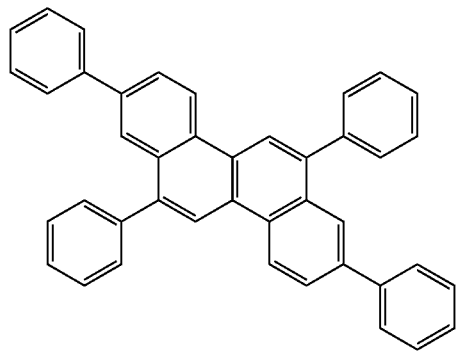
ET14
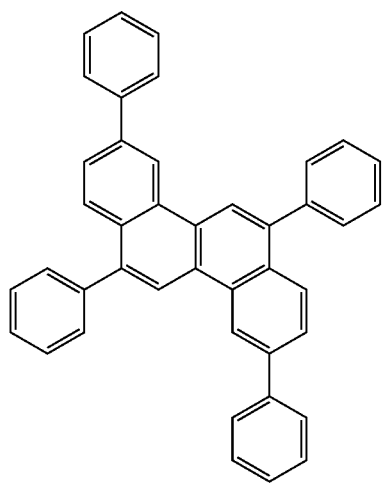
ET15
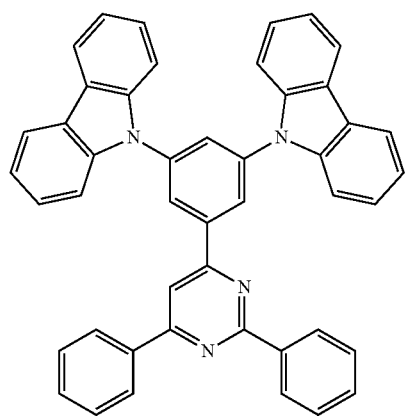
ET16
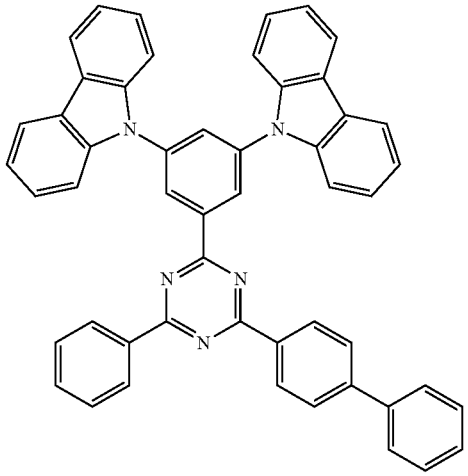
ET17
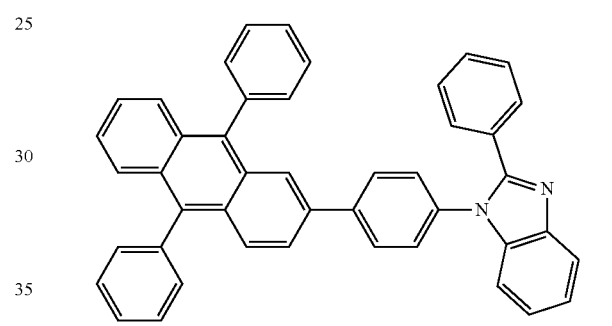
ET18
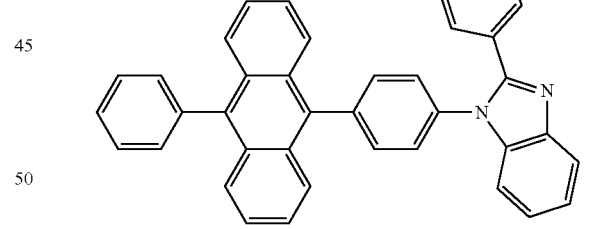
ET19
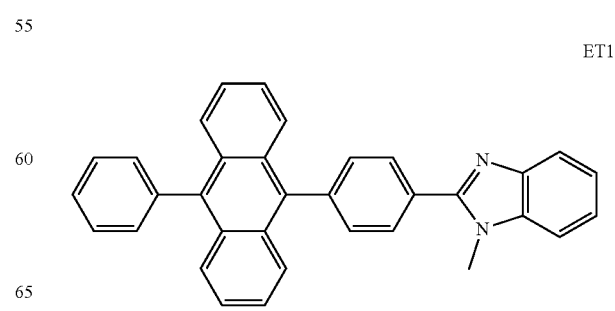

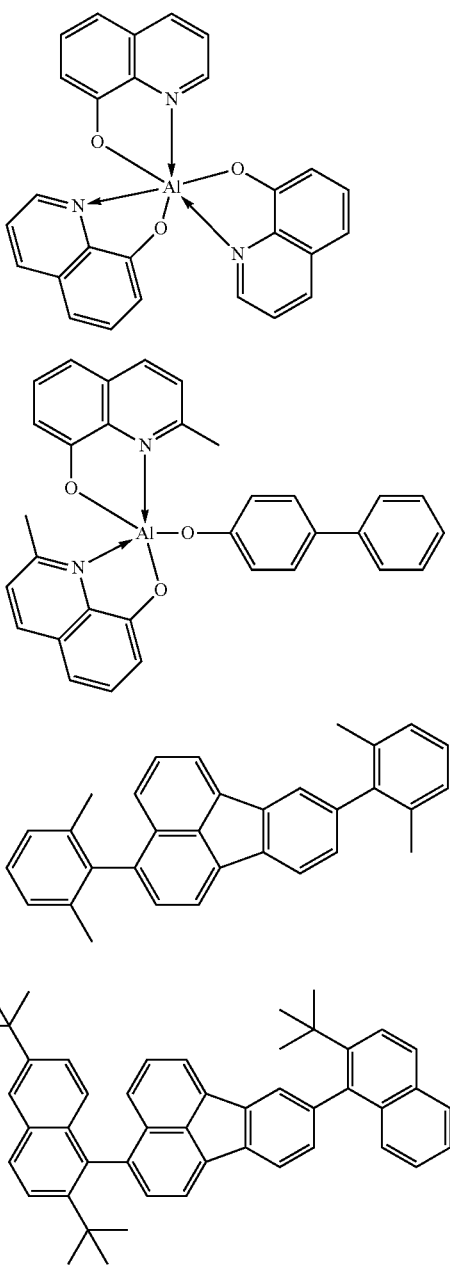

ET20

ET21

ET22

ET23

Among the electron transport materials exemplified above, hole blocking materials are preferably compounds consisting of hydrocarbons from the viewpoint of binding stability.

The electron transport material is preferably a material having a pyridinediyl group or a phenanthrolinediyl group as a substituent, such as ET1, ET2, ET3, ET4, ET5, ET6, ET7, or ET8. This is because such a material interacts with electron injection materials, such as alkali metal compounds, and electrode materials and exhibits the effect of reducing the electron injection barrier.

The electron injection layer of the organic EL element according to this embodiment may be formed by using a mixture of an electron-donating dopant and an electron transport material. Examples of the electron-donating dopant that can be used include alkali metals, alkaline earth metals, rare-earth metals, and compounds thereof. The electron injection layer is formed by incorporating 0.1% by weight to 25% by weight of an alkali metal compound in an electron transport material. More preferably, the alkali metal compound is a cesium compound. Still more preferably, the cesium compound includes cesium carbonate and a substance derived from cesium carbonate.

In the present invention, a suitable method for forming the electron injection layer is co-deposition of cesium carbonate and an electron transport material. In order to ensure a good electron-injecting property, the electron injection layer preferably has a thickness of 10 nm to 100 nm. Suboxides such as $(Cs_{11}O_3)Cs_{10}$, $(Cs_{11}O_3)Cs$, and $Cs_{11}O_3$, all of which are derived from cesium carbonate, may be formed in the electron injection layer by, for example, decomposition of cesium carbonate during co-deposition. In addition, a coordination compound may be formed between cesium and an organic compound.

The organic compound layers that form the organic EL element according to this embodiment can be formed by employing a dry process such as a vacuum vapor deposition method, an ionized vapor deposition method, sputtering, or plasma. Alternatively, instead of the dry process, it is also possible to employ a wet process in which a material is dissolved in a suitable solvent, and a layer is formed by a known coating method (such as spin coating, dipping, a casting method, a Langmuir-Blodgett (LB) method, or an ink jet method).

When a layer is formed by, for example, a vacuum vapor deposition method or a solution coating method, crystallization or the like is unlikely to occur, and the resulting layer has good stability with time. In the case of forming a layer by a coating method, the layer may be formed by using a suitable binder resin in combination.

Examples of the binder resin include, but are not limited to, polyvinylcarbazole resins, polycarbonate resins, polyester resins, acrylonitrile-butadiene-styrene (ABS) resins, acrylic resins, polyimide resins, phenolic resins, epoxy resins, silicone resins, and urea resins.

These binder resins may be used alone as a homopolymer or a copolymer or may be used as a mixture of two or more thanreof. Furthermore, known additives such as a plasticizer, an oxidation inhibitor, and an ultraviolet absorbent may be optionally used in combination.

(Protective Layer)

A protective layer of the organic EL element according this embodiment may be a silicon nitride (SiN) layer or a silicon oxynitride (SiON) layer formed by chemical vapor deposition (CVD) or an aluminum oxide layer formed by atomic layer deposition (ALD), or may be formed of a material having very low permeability to external oxygen and moisture, such as silicon oxide or titanium oxide. The protective layer may be constituted by a single layer or a plurality of layers as long as the protective layer has a sufficiently high moisture barrier performance. When the protective layer is constituted by a plurality of layers, layers individually composed of different materials may be stacked or layers that are composed of the same material but have different densities may be stacked. The protective layer is preferably formed in consideration of the refractive index so that light emitted from the organic light-emitting element is easily extracted to the outside of the apparatus. The protective layer may also be referred to as a sealing layer. The thickness of the protective layer is not limited, but is preferably 1.6 μm or more and 3.0 μm or less, and more preferably 2.0 μm or more and 2.8 μm or less.

(Planarization Layer)

A planarization layer of the organic EL element according to this embodiment is a layer for filling irregularities of the protective layer and is preferably disposed on the protective layer. This structure can reduce scattered light generated by sloped portions of the irregularities of the protective layer to thereby suppress color mixture. The planarization layer is constituted by, for example, a resin layer formed by coating.

(Color Filter)

A color filter of the organic EL element according to this embodiment is formed by applying a color resist onto the planarization layer and patterning the color resist by lithography. The color resist is formed of, for example, a photo-curable resin, and regions irradiated with, for example, ultraviolet rays are cured to form a pattern. The negative/positive form of the pattern obtained by curing with ultraviolet rays may be reversed.

In this embodiment, the color filter may have RGB color filters. The RGB color filters may be arranged in any of a stripe array, a square array, a delta array, and a Bayer array.

(Filling Layer)

A filling layer of the organic EL element according to this embodiment is disposed between the color filter and an opposite substrate. The filling layer is formed of, for example, an organic material such as an acrylic resin, an epoxy resin, or a silicone resin. A planarization layer may be formed between the color filter and the filling layer. This planarization layer may be the same as or different from the planarization layer disposed between the color filter and the protective layer. These two planarization layers are preferably formed of the same material because high adhesion between the planarization layers is achieved outside the display area.

(Opposite Substrate)

The opposite substrate of the organic light-emitting element according to this embodiment is preferably a transparent substrate. The opposite substrate may be constituted by, for example, a transparent glass substrate or a transparent plastic substrate.

The organic light-emitting element may contain a binder resin. Examples of the binder resin include polyvinylcarbazole resins, polycarbonate resins, polyester resins, ABS resins, acrylic resins, polyimide resins, phenolic resins, epoxy resins, silicone resins, and urea resins. However, the binder resins are not limited to these. These binder resins may be used alone as a homopolymer or a copolymer or may be used as a mixture of two or more thanreof. Furthermore, known additives such as a plasticizer, an oxidation inhibitor, and an ultraviolet absorbent may be optionally used in combination.

(Applications of Organic EL Element According to the Embodiment)

The organic EL element according to this embodiment can be used as a component of a display apparatus or an illumination apparatus. In addition, the organic EL element is applicable to, for example, an exposure light source of an electrophotographic image-forming apparatus, a backlight of a liquid crystal display apparatus, or a light-emitting device including a white light source provided with a color filter. Examples of the color filter include filters through which any of three colors, namely, red, green, and blue, transmits.

A display apparatus according to this embodiment includes a plurality of pixels, and at least one of these pixels includes the organic EL element according to this embodiment. This pixel includes the organic EL element according to this embodiment and an active element. The active element may be a switching element or an amplifying element. Specifically, the active element may be a transistor. Either the anode or the cathode of this organic EL element is electrically connected to either the drain electrode or the source electrode of the transistor. The transistor may contain an oxide semiconductor in the active region thereof. The oxide semiconductor may be amorphous or crystalline, or may be a mixture of an amorphous phase and a crystalline phase. If the oxide semiconductor is crystalline, the oxide semiconductor may be monocrystalline, microcrystalline, or in a crystalline state in which a specific axis, such as the C-axis, is oriented, or may be in a mixed state of at least two of these.

An organic EL apparatus including such switching elements may be used as an image display apparatus in which organic EL elements are provided as pixels, or may be used as an illumination apparatus. Alternatively, the organic EL apparatus may be used as an exposure light source configured to expose a photoreceptor of an electrophotographic image-forming apparatus, such as a laser beam printer or a copy machine.

Here, the display apparatus can be used as an image display apparatus of a personal computer (PC), a smartphone, a digital camera, a portable game machine, or the like. The transistor may be, for example, a TFT element. The TFT element is provided, for example, on an insulating surface of a substrate.

A display unit included in an imaging apparatus or an ink jet printer may have a touch panel function. The touch panel function may be operated by using an infrared system, an electrostatic capacitance system, a resistive film system, or an electromagnetic induction system. The operation system is preferably an electrostatic capacitance system. The display apparatus may be used in a display unit of a multifunctional printer.

The illumination apparatus is, for example, an apparatus that illuminates a room. Among organic EL elements included in the illumination apparatus, at least one of the organic EL elements is the organic EL element according to the present invention.

Figure 5:
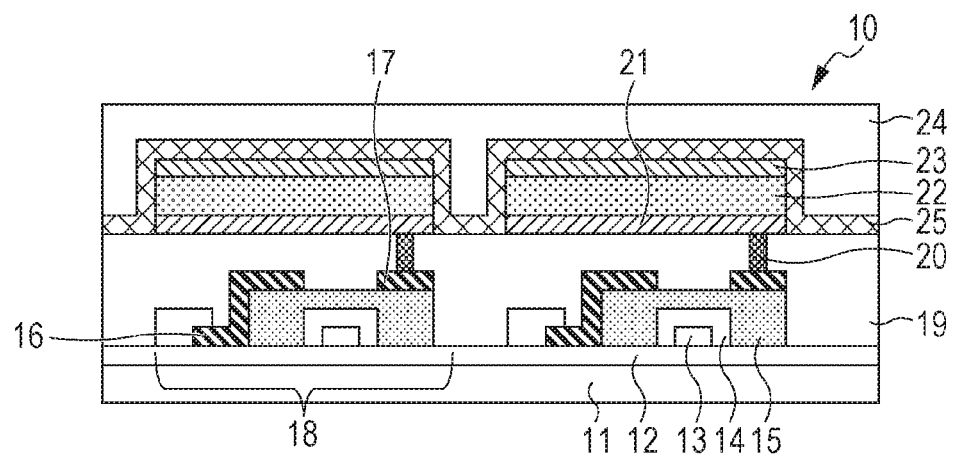
FIG. 5 is a schematic sectional view of an example of a display apparatus including organic EL elements according to the embodiment.

Next, a display apparatus according to this embodiment will be described with reference to the drawings. FIG. 5 is a schematic sectional view illustrating an example of a display apparatus that includes organic EL elements and TFT elements connected to the organic EL elements. The TFT elements are each an example of an active element.

A display apparatus 10 in FIG. 5 includes a substrate 11 made of, for example, glass and a moisture-proof film 12 that is disposed on the substrate 11 and configured to protect TFT elements or organic compound layers. Reference numeral 13 denotes a gate electrode 13 made of a metal. Reference numeral 14 denotes a gate insulating film 14, and reference numeral 15 denotes a semiconductor layer.

TFT elements 18 each include the semiconductor layer 15, a drain electrode 16, and a source electrode 17. An insulating film 19 is disposed over the TFT elements 18. An anode 21 that forms an organic EL element is connected to the source electrode 17 through a contact hole 20.

The form of electrical connection between electrodes (anode and cathode) included in the organic EL element and electrodes (source electrode and drain electrode) included in a TFT is not limited to the configuration illustrated in FIG. 5. Specifically, any configuration may be employed as long as one type of the anode and the cathode is electrically connected to one of the source electrode and the drain electrode of the TFT element.

In the display apparatus 10 in FIG. 5, an organic compound layer is illustrated as if an organic compound layer 22 is formed of a single layer. Alternatively, the organic layer 22 may be formed of a plurality of layers. A first protective layer 24 and a second protective layer 25 configured to suppress deterioration of the organic EL elements are disposed over a cathode 23.

In the display apparatus 10 in FIG. 5, transistors are used as switching elements. Alternatively, metal-insulator-metal (MIM) elements may be used as the switching elements instead of the transistors.

The transistors used in the display apparatus 10 in FIG. 5 are not limited to transistors formed by using a single-crystal silicon wafer. Alternatively, the transistors may be thin-film transistors having an active layer on the insulating surface of the substrate. The active layer may be formed of single-crystal silicon, non-single-crystal silicon such as amorphous silicon or microcrystalline silicon, or a non-single-crystal oxide semiconductor such as indium zinc oxide or indium gallium zinc oxide. Thin-film transistors are also referred to as TFT elements.

The transistors included in the display apparatus 10 in FIG. 5 may be formed in a substrate such as a Si substrate. Herein, the expression "formed in a substrate" means that transistors are produced by processing a substrate itself, such as a Si substrate. That is, having transistors in a substrate can also be considered that a substrate and transistors are formed as a single component.

Whether transistors are formed in the substrate is selected in accordance with the resolution. For example, in the case of a size of 1 inch and a resolution of a QVGA level, transistors are preferably formed in a Si substrate.

Figure 6:
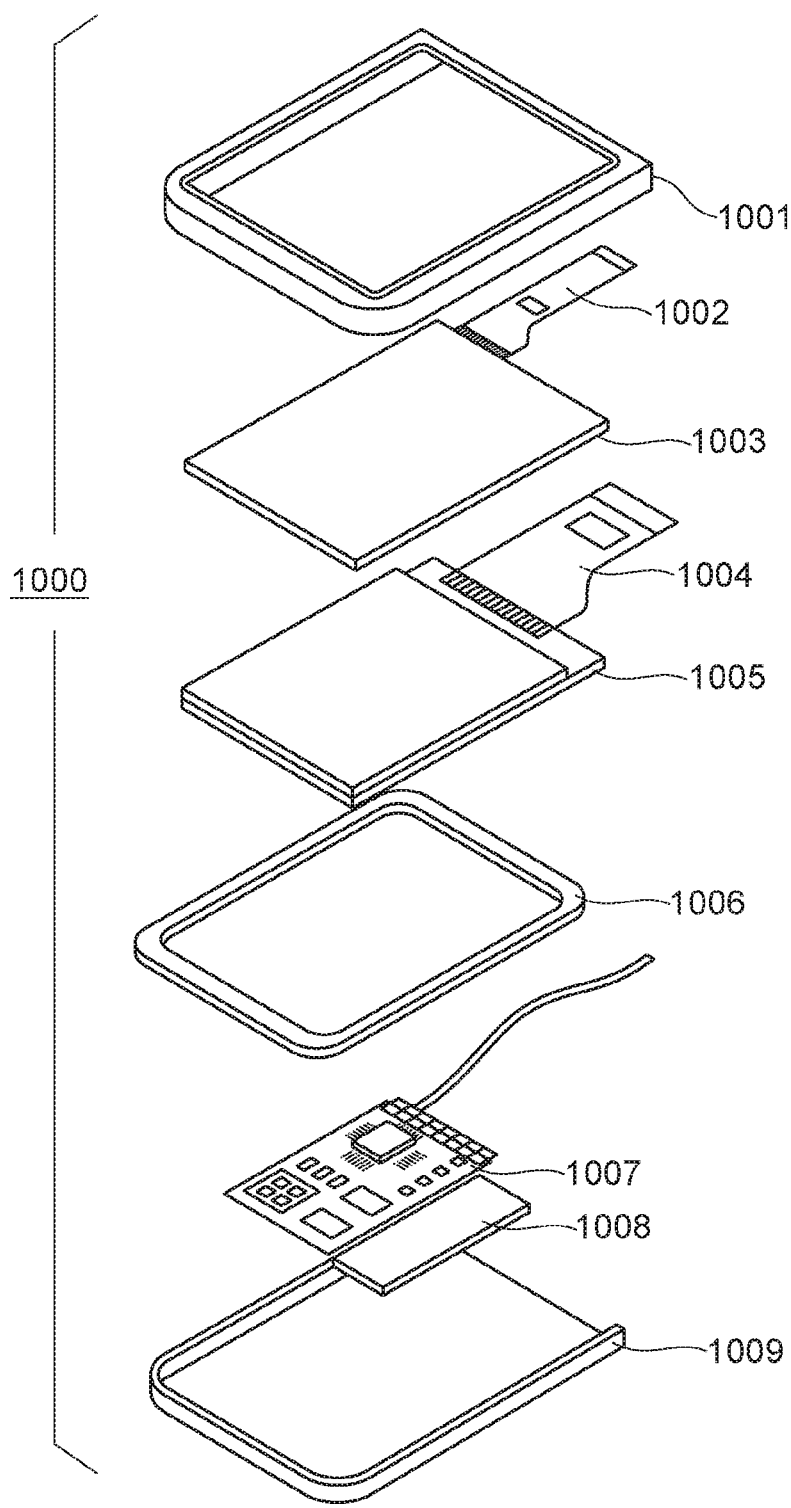
FIG. 6 is a schematic view illustrating an example of a display apparatus according to the embodiment.

FIG. 6 is a schematic view illustrating an example of the display apparatus according to this embodiment. A display apparatus 1000 may include an upper cover 1001 and a lower cover 1009, and a touch panel 1003, a display panel 1005, a frame 1006, a circuit board 1007, and a battery 1008 that are disposed between the upper cover 1001 and the lower cover 1009. The touch panel 1003 and the display panel 1005 are connected to flexible printed circuits (FPC) 1002 and 1004, respectively. Transistors are printed on the circuit board 1007. The battery 1008 is not necessarily provided unless the display apparatus is a mobile device. Even when the display apparatus is a mobile device, the battery 1008 need not necessarily be disposed at this position.

The display apparatus according to this embodiment may be used in a display unit of an imaging apparatus that includes an optical unit including a plurality of lenses and an imaging element that receives light which has passed through the optical unit. The display apparatus may include a display unit configured to display information acquired by the imaging element. The display unit may be a display unit exposed to the outside of the imaging apparatus or a display unit disposed in a finder. The imaging apparatus may be a digital camera or a digital camcorder.

Figure 7:
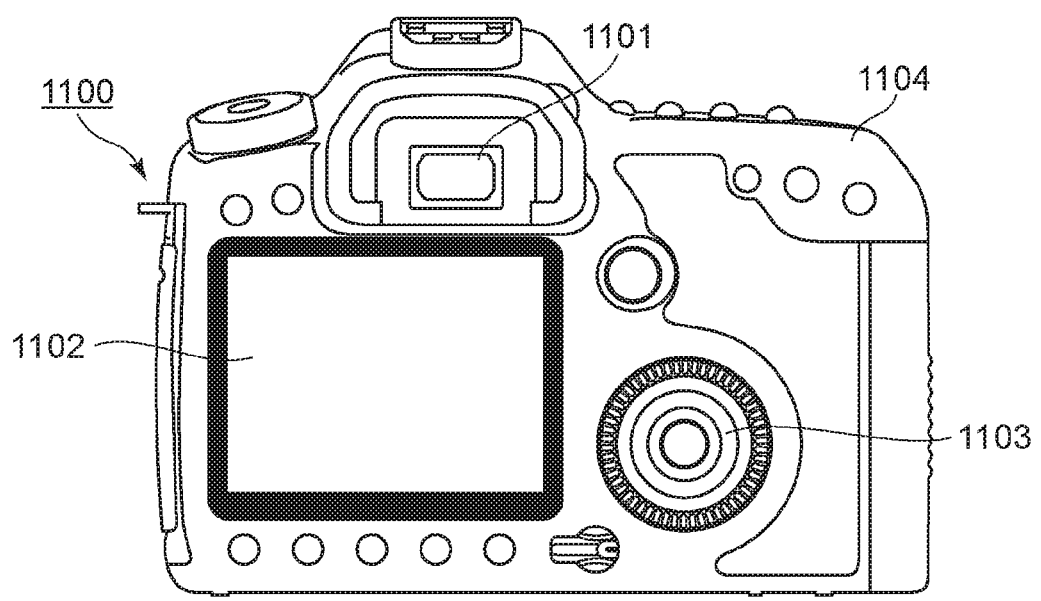
FIG. 7 is a schematic view illustrating an example of an imaging apparatus according to the embodiment.

FIG. 7 is a schematic view illustrating an example of an imaging apparatus according to this embodiment. An imaging apparatus 1100 may include a viewfinder 1101, a rear display 1102, an operation unit 1103, and a housing 1104. The viewfinder 1101 may include the display apparatus according to this embodiment. In such a case, the display apparatus may display not only an image to be captured but also, for example, environmental information and imaging instructions. The environmental information may include, for example, the intensity of external light, the direction of the external light, the moving speed of a subject, and the possibility that the subject is hidden by an object.

Since the suitable timing for capturing an image is a very short time, it is desirable to display information as quickly as possible. Accordingly, the display apparatus that includes the organic EL element according to the present invention is preferably used. This is because the organic EL element has a high response speed. The display apparatus that includes an organic EL element can be more suitably used for such apparatuses required to have a high display speed than liquid crystal display apparatuses.

The imaging apparatus 1100 includes an optical unit (not illustrated). The optical unit includes a plurality of lenses and forms an image on an imaging element disposed in the housing 1104. The focus can be adjusted by adjusting the relative positions of the plurality of lenses. This operation can also be automatically performed.

The display apparatus according to this embodiment may include red, green, and blue color filters. The red, green, and blue color filters may be arranged in a delta array.

The display apparatus according to this embodiment may be used in a display unit of a mobile terminal. In such a case, the display apparatus may have both a display function and an operational function. Examples of the mobile terminal include mobile phones such as smartphones, tablet computers, and head-mounted displays.

Figure 8:
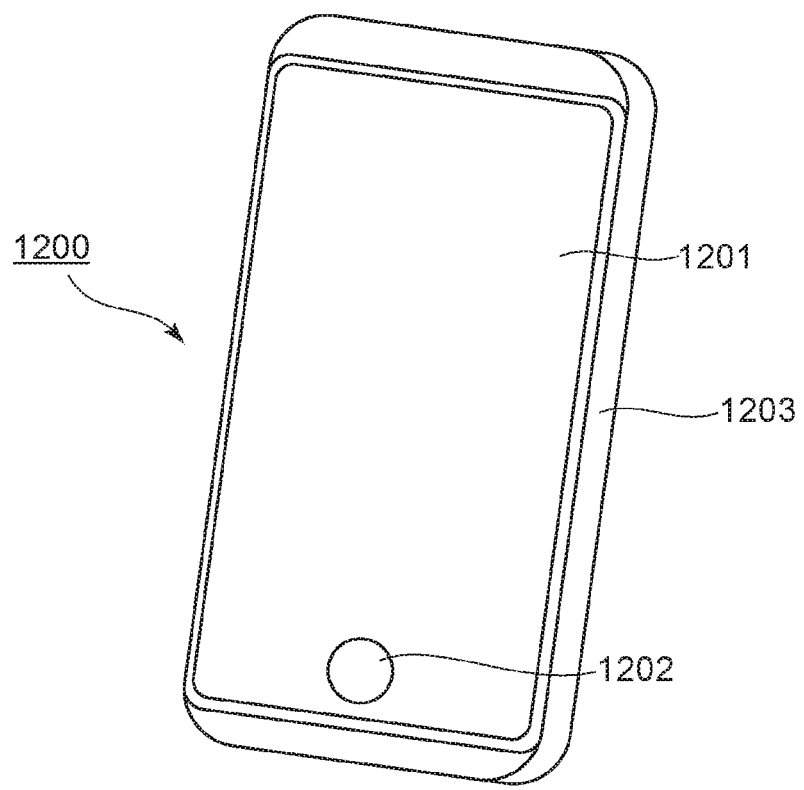
FIG. 8 is a schematic view illustrating an example of a mobile device according to the embodiment.

FIG. 8 is a schematic view illustrating an example of an electronic device according to this embodiment. An electronic device 1200 includes a display unit 1201, an operation unit 1202, and a housing 1203. The housing 1203 may include therein circuits, a printed board having the circuits, a battery, and a communication unit. The operation unit 1202 may be a button or a touch-panel response unit. The operation unit may be a biometric authentication unit configured to, for example, recognize the fingerprint and release the lock. An electronic device including a communication unit may also be referred to as a communication device.

Figure 9A:
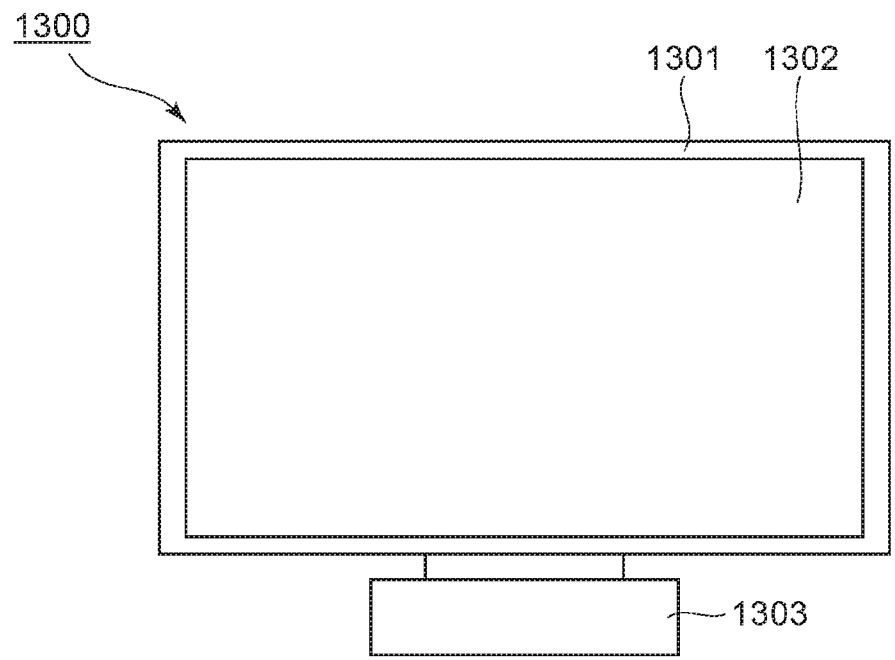
FIG. 9A is a schematic view illustrating an example of a display apparatus according to the embodiment.

FIG. 9 includes schematic views each illustrating an example of the display apparatus according to this embodiment. FIG. 9A illustrates a display apparatus such as a television monitor or a PC monitor. A display apparatus 1300 includes a frame 1301 and a display unit 1302. The light-emitting device according to this embodiment may be used in the display unit 1302.

The display apparatus 1300 further includes a base 1303 that supports the frame 1301 and the display unit 1302. The base 1303 is not limited to the configuration illustrated in FIG. 9A. Alternatively, the lower side of the frame 1301 may also function as the base.

The frame 1301 and the display unit 1302 may be curved. The radius of curvature of the frame 1301 and the display unit 1302 may be 5,000 mm or more and 6,000 mm or less.

Figure 9B:
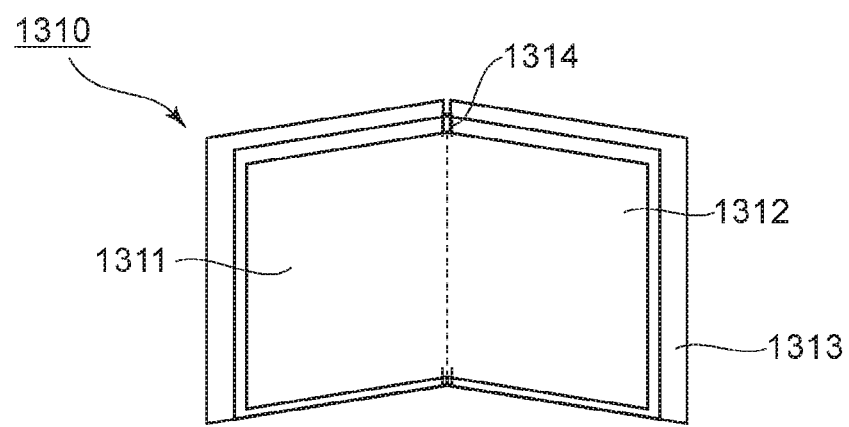
FIG. 9B is a schematic view illustrating an example of a foldable display apparatus.

FIG. 9B is a schematic view illustrating another example of the display apparatus according to this embodiment. A display apparatus 1310 illustrated in FIG. 9B is configured to be foldable and is a so-called foldable display apparatus. The display apparatus 1310 includes a first display unit 1311, a second display unit 1312, a housing 1313, and a folding point 1314. Each of the first display unit 1311 and the second display unit 1312 may include the light-emitting device according to this embodiment. The first display unit 1311 and the second display unit 1312 may constitute a single display apparatus without a joint. The first display unit 1311 and the second display unit 1312 can be separated from each other in the folding point. The first display unit 1311 and the second display unit 1312 may display images that are different from each other. Alternatively, a single image may be displayed on a set of the first display unit and the second display unit.

Figure 10:
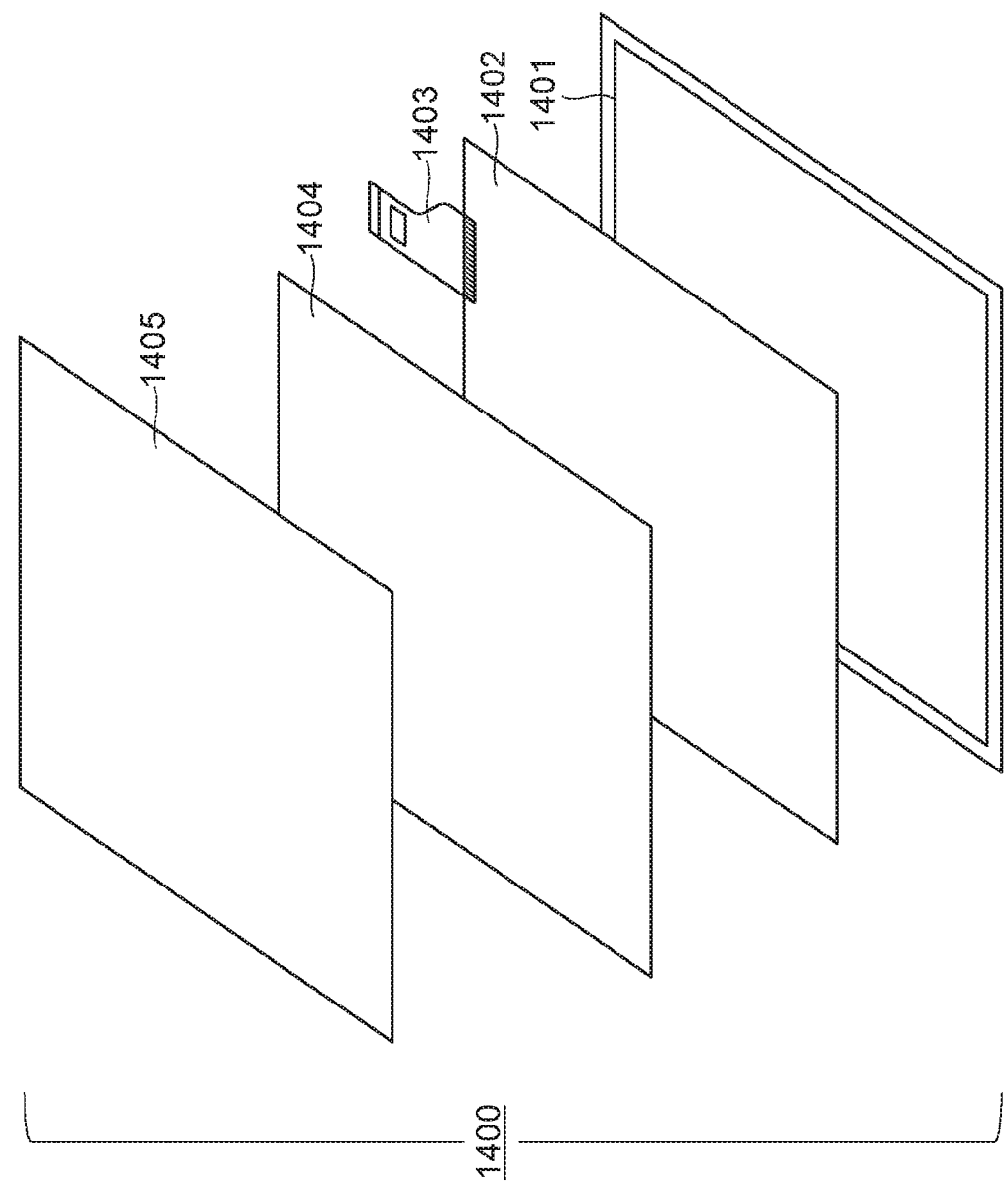
FIG. 10 is a schematic view illustrating an example of an illumination apparatus according to the embodiment.

FIG. 10 is a schematic view illustrating an example of an illumination apparatus according to this embodiment. An illumination apparatus 1400 may include a housing 1401, a light source 1402, a circuit board 1403, an optical film 1404, and a light diffusion unit 1405. The light source may include the organic EL element according to this embodiment. The optical film may be a film disposed on the light emission side of the light source and configured to improve the color rendering properties of the light source. The light diffusion unit effectively diffuses light emitted from the light source and allows the light to reach a wide region, for example, for lighting up. A cover may be optionally disposed on an outermost portion.

The illumination apparatus is, for example, an apparatus that illuminates a room. The illumination apparatus may be configured to emit light of any color of white, neutral white, and other colors from blue to red. The illumination apparatus may include a light modulation circuit configured to modulate the light. The illumination apparatus may include the organic EL element according to the present invention and a power supply circuit connected to the organic EL element. The power supply circuit is a circuit configured to convert an alternating-current voltage to a direct-current voltage. The white corresponds to a color temperature of 4,200 K, and the neutral white corresponds to a color temperature of 5,000 K. The illumination apparatus may include a color filter.

The illumination apparatus according to this embodiment may include a heat dissipation unit. The heat dissipation unit is configured to dissipate heat in the apparatus to the outside of the apparatus and may be made of, for example, a metal having a high specific heat or liquid silicone.

Figure 11:
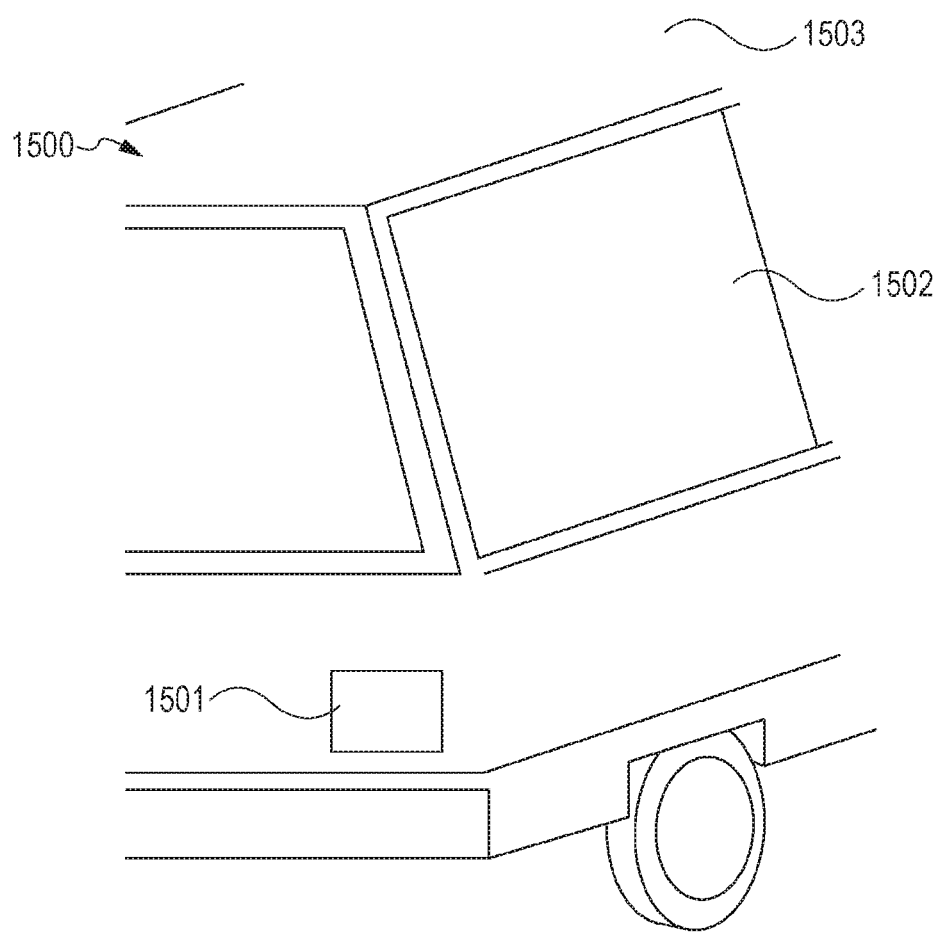
FIG. 11 is a schematic view illustrating an example of an automobile according to the embodiment.

FIG. 11 is a schematic view of an automobile including a tail lamp which is an example of a lighting fixture according to this embodiment. An automobile 1500 includes a tail lamp 1501, and the tail lamp may be configured to light up when, for example, the brakes are applied.

The tail lamp 1501 may include the organic EL element according to this embodiment. The tail lamp may include a protective member configured to protect the organic EL element. The protective member may be formed of any material as long as the strength of the protective member is high to a certain extent, and the protective member is transparent. The protective member is preferably formed of, for example, polycarbonate. The polycarbonate may be mixed with, for example, a furandicarboxylic acid derivative or an acrylonitrile derivative.

The automobile 1500 may include an automobile body 1503 and a window 1502 attached to the automobile body 1503. The window may be a transparent display unless it is a window for checking the front and rear of the automobile. The transparent display may include the organic EL element according to this embodiment. In such a case, the members, such as electrodes, of the organic EL element are formed of transparent materials.

The automobile according to this embodiment is an example of a moving object. The moving object may be, for example, a drone or a ship. The drone or ship may include a body and a lighting fixture disposed on the body. The lighting fixture may emit light for notifying the position of the body.

EXAMPLES

Example 1

<Evaluation of HOMO/LUMO>

Host materials, dopant materials, and intermediate layer materials were evaluated by the methods described below. Table 2 shows the results.

A) Method for Evaluating HOMO

A thin film having a thickness of 30 nm was formed on an aluminum substrate, and the HOMO of the thin film was measured with an AC-3 (manufactured by Riken Keiki Co., Ltd.).

B) Method for Evaluating LUMO

A thin film having a thickness of 30 nm was formed on a quartz substrate. Regarding the thin film which was a material to be measured, the optical band gap (absorption edges) of the material was determined with a spectrophotometer (V-560 manufactured by JASCO Corporation). The sum of the optical band gap value and the above HOMO value was determined as the LUMO. Table 2 shows the results.

Table 2 also shows calculated values determined by molecular orbital calculations. Comparisons between the calculated values and the measured values show that there is a correlation between HOMO energy and LUMO energy. Accordingly, in the following Examples, numerical values of HOMO energy and LUMO energy determined from the calculated values are used to discuss the results of elements.

TABLE 2

| Compound | HOMO (eV) Measured value | LUMO (eV) Measured value | HOMO (eV) Calculated value | LUMO (eV) Calculated value | | Compound | HOMO (eV) Measured value | LUMO (eV) Measured value | HOMO (eV) Calculated value | LUMO (eV) Calculated value |
|---|---|---|---|---|---|---|---|---|---|---|
| Host EM1 | −6.02 | −3.10 | −5.11 | −1.67 | Blue dopant | BD1 | −5.46 | −2.67 | −4.73 | −1.47 |
| EM2 | −5.96 | −3.04 | −5.06 | −1.62 | | BD4 | −5.56 | −2.77 | −5.08 | −1.49 |
| EM3 | −5.94 | −2.95 | −5.14 | −1.62 | | BD8 | −6.05 | −3.26 | −5.18 | −1.72 |
| EM4 | −6.00 | −3.01 | −5.19 | −1.66 | | BD9 | −6.08 | −3.38 | −5.24 | −1.84 |
| EM5 | −6.03 | −3.06 | −5.12 | −1.64 | | BD15 | −6.10 | −3.40 | −5.20 | −1.91 |
| EM7 | −6.01 | −3.13 | −5.02 | −1.70 | | BD19 | −6.11 | −3.48 | −5.49 | −2.21 |
| EM10 | −6.31 | −2.83 | −5.67 | −1.21 | | BD20 | −5.90 | −3.30 | −5.04 | −1.82 |
| EM13 | −5.99 | −3.06 | −5.13 | −1.46 | | BD23 | −6.20 | −3.52 | −5.44 | −2.06 |
| EM17 | −5.73 | −3.53 | −4.68 | −2.07 | | BD24 | −6.08 | −3.38 | −5.32 | −1.94 |
| EM22 | −5.80 | −3.20 | −4.94 | −1.77 | | BD25 | −6.10 | −3.40 | −5.02 | −1.91 |
| EM27 | −6.22 | −3.11 | −5.73 | −1.87 | Green dopant | GD3 | −5.40 | −2.60 | −4.74 | −1.83 |
| | | | | | | GD4 | −5.58 | −3.03 | −4.70 | −1.85 |
| | | | | | | GD7 | −5.77 | −3.57 | −5.00 | −1.97 |
| | | | | | | GD9 | −5.94 | −3.45 | −5.02 | −1.96 |
| | | | | | | GD10 | −5.87 | −3.49 | −5.01 | −1.98 |
| | | | | | | GD11 | −5.82 | −3.51 | −5.00 | −1.97 |
| | | | | | | GD22 | −5.90 | −3.40 | −5.02 | −2.06 |
| | | | | | | GD27 | −5.84 | −3.52 | −4.95 | −2.08 |

TABLE 2-continued

| Compound | HOMO (eV) Measured value | LUMO (eV) Measured value | HOMO (eV) Calculated value | LUMO (eV) Calculated value | Compound | HOMO (eV) Measured value | LUMO (eV) Measured value | HOMO (eV) Calculated value | LUMO (eV) Calculated value |
|---|---|---|---|---|---|---|---|---|---|
| Red dopant | | | | | RD2 | −5.40 | −3.30 | −4.65 | −2.30 |
| | | | | | RD5 | −5.62 | −3.63 | −4.72 | −2.32 |
| | | | | | R10 | −5.60 | −3.55 | −4.78 | −2.37 |
| | | | | | RD15 | −5.55 | −3.50 | −4.63 | −2.34 |
| | | | | | RD21 | −5.65 | −3.61 | −4.87 | −2.52 |

Example 2

In this Example, a top-emission-type organic EL element was produced in which an anode, a hole injection layer, a hole transport layer, an electron blocking layer, a first light-emitting layer, a second light-emitting layer, a third light-emitting layer, a hole blocking layer, an electron transport layer, an electron injection layer, and a cathode were sequentially formed on a substrate.

On a glass substrate, Al (65 nm)/Ti (6 nm) were deposited by a sputtering method, and the resulting film was patterned by photolithography to form an anode. At this time, the area of the electrode facing the cathode was adjusted to 3 mm$^2$.

Subsequently, the substrate having the electrode after being cleaned, and materials were placed in a vacuum vapor deposition apparatus (manufactured by ULVAC, Inc.). The apparatus was evacuated to $1.0 \times 10^{-4}$ Pa ($1 \times 10^{-6}$ Torr), and UV/ozone cleaning was then conducted. Subsequently, layers were formed so as to have the layer configuration shown in Table 3 below.

The resulting white organic EL element satisfies the preferred configurations (1) to (13) according to the above embodiment.

TABLE 3

| | Material | | | Thickness (nm) |
|---|---|---|---|---|
| Hole injection layer | | HT16 | | 7 |
| Hole transport layer | | HT2 | | 18 |
| Electron blocking layer | | HT7 | | 10 |
| First light-emitting layer (red and green-light-emitting layer) | Host | EM1 | Weight ratio EM1:RD5:GD10 = 97.6:0.4:2.0 | 7 |
| | Red dopant | RD5 | | |
| | Green dopant | GD10 | | |
| Second light-emitting layer (blue-light-emitting layer) | Host | EM1 | Weight ratio EM1:BD24 = 99.4:0.6 | 13 |
| | Blue dopant | BD24 | | |
| Third light-emitting layer (green-light-emitting layer) | Host | EM1 | Weight ratio EM1:GD10 = 99.5:0.5 | 3 |
| | Green dopant | GD10 | | |
| Hole blocking layer | | ET12 | | 70 |
| Electron transport layer | | ET2 | | 30 |
| Electron injection layer | | LiF | | 1 |
| Cathode | | Mg Ag | Weight ratio Mg:Ag = 50:50 | 10 |

After the formation of the cathode, the substrate was moved into a glove box and sealed, in a nitrogen atmosphere, with a glass cap containing a drying agent. Thus, a white organic EL element was obtained.

The white organic EL element obtained as described above was connected to a voltage application device, and characteristics of the white organic EL element were evaluated. Current-voltage characteristics were measured with a microammeter 4140B manufactured by Hewlett-Packard Company. The acquisition of an emission spectrum and the evaluation of chromaticity were performed by using an "SR-3" manufactured by Topcon Corporation. The emission luminance was measured with a BM7 manufactured by Topcon Corporation.

Figure 3:
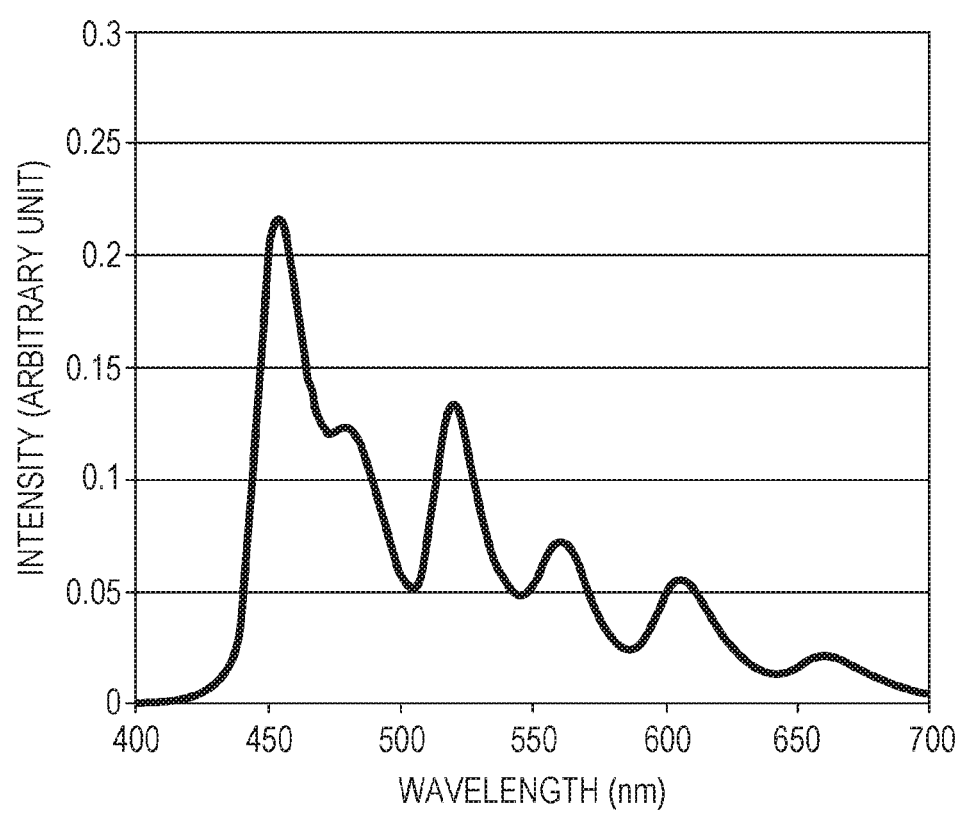
FIG. 3 is an emission spectrum of a white organic EL element in Example.

The efficiency, the voltage, and the CIE chromaticity coordinates during display at 1,000 cd/m$^2$ were 7.3 cd/A, 3.7 V, and (0.25, 0.30), respectively. The element was a good white organic EL element which had high efficiency and a low driving voltage and check grammar white light emission chromaticity was unlikely to change when the voltage was varied. FIG. 3 shows a white color spectrum obtained above.

Next, spectra and luminances in the case where red, green, and blue color filters were formed on the white organic EL element were determined by calculations. By using the above EL elements of the three colors, the current necessary during white (CIE chromaticity coordinates: 0.31, 0.33) display at 500 cd/m$^2$ was calculated for red, green, and blue colors.

According to the results, red was 53 mA/cm$^2$, green was 47 mA/cm$^2$, and blue was 54 mA/cm$^2$. Thus, a white organic EL element having a good balance of light emission among red, green, and blue was obtained.

Examples 3 to 8

Elements were produced as in Example 2 except that some of the materials used as light-emitting layers were changed, and evaluated in the same manner Table 4 summarizes the materials used as the light-emitting layers. With regard to the energy levels, not measured values but calculated values that are also shown in Table 2 of Example 1 are shown. In the present specification, absolute values of the energy levels are compared by using a sign of inequality; however, in Table 4, negative values are expressed as they are.

According to the evaluation results, characteristics of the organic EL elements of Examples 3 to 8 were substantially unchanged from those of Example 2, and the organic EL elements of Examples 3 to 7 were white organic EL elements having a low driving voltage and a good balance of light emission among red, green, and blue.

Presumably, since the white organic EL elements obtained here satisfied (1) to (13), which are preferred configurations in the above embodiment, as in Example 2, the elements were white organic EL elements having a low driving voltage and a good balance of light emission among red, green, and blue, which were substantially the same as the white organic EL element in Example 2.

Comparative Example 1

An element was produced as in Example 2 except that the element did not include the third light-emitting layer, and evaluated in the same manner Table 4 summarizes the materials used as the light-emitting layers. Comparative Example 1 is an organic EL element having a configuration disclosed in PTL 3.

Figure 4:
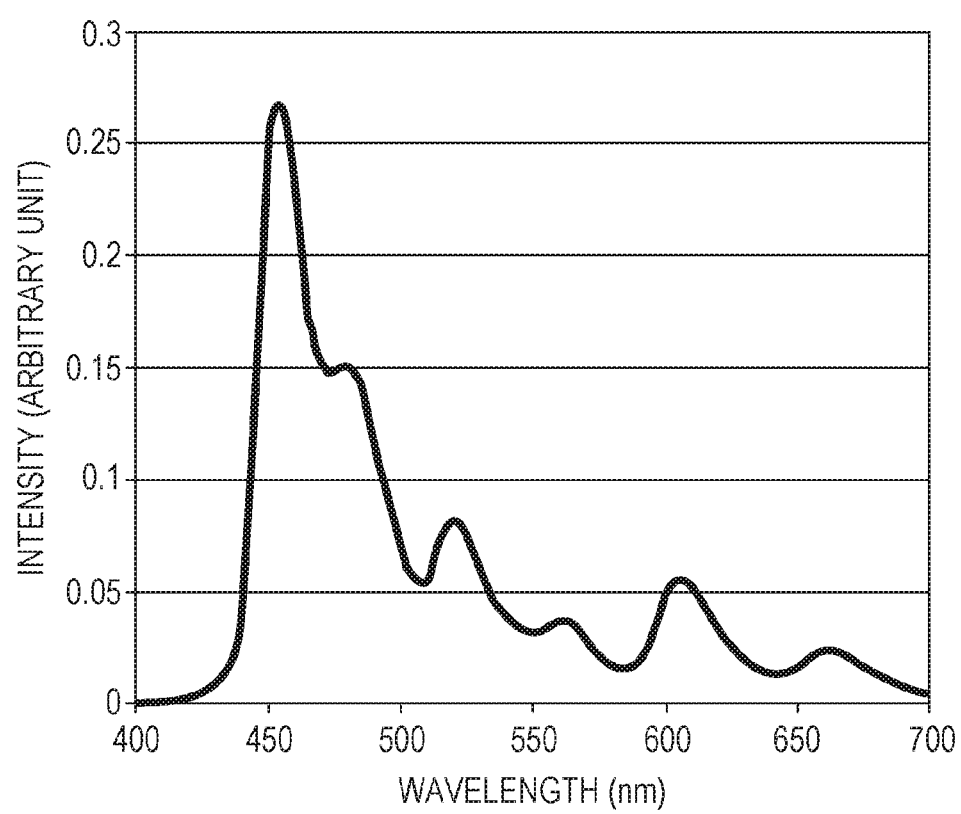
FIG. 4 is an emission spectrum of a white organic EL element in Comparative Example.

The efficiency, the voltage, and the CIE chromaticity coordinates during display at 1,000 cd/m² were 5.5 cd/A, 3.8 V, and (0.22, 0.21), respectively. The element was a white organic EL element having a low efficiency because, as compared with Example 2, the luminance of green light emission decreased, although the luminance of blue light emission was high. FIG. 4 shows a white color spectrum obtained above. When the voltage was decreased in order to reduce the emission luminance, the proportion of the red light emission increased, and a change in the chromaticity of white light emission was observed.

Next, as in Example 2, the current necessary during white (CIE chromaticity coordinates: 0.31, 0.33) display at 500 cd/m² in the case where red, green, and blue color filters were formed was calculated for red, green, and blue colors.

According to the results, red was 54 mA/cm², green was 73 mA/cm², and blue was 41 mA/cm². Thus, the element was a white organic EL element having a low green luminance and a high blue luminance and having a poor balance. Since the third light-emitting layer was not provided, green light emission occurs only from the first light-emitting layer. The results showed that there was room for improvement in the balance with light emission.

Since Comparative Example 1 does not include the third light-emitting layer among the first to third light-emitting layers according to the above embodiment, the chromaticity of white light emission may change in some cases. In Comparative Example 1, the element had a low driving voltage because there were no barriers for holes and electrons.

about 10%, but the element was a white organic EL element having a good balance of light emission among red, green, and blue.

It is considered that the interference of green light is weakened by changing the positions of the blue-light-emitting layer and the green-light-emitting layer, and consequently, the light-extraction efficiency of emitted green light slightly decreased.

Example 10

An element was produced as in Example 2 except that the concentration of the green dopant material GD10 in the first light-emitting layer was changed to 5% by weight, and was evaluated in the same manner.

According to the results, the driving voltage of the element during display at 1,000 cd/m² was 4.0 V, which was slightly higher than that of the element of Example 1; however, the element was a white organic EL element having a good balance of light emission among red, green, and blue.

Since the concentration of the green dopant material was increased, the concentration of the host material decreased. It is considered that, consequently, the effect achieved by using the common host material decreased, resulting in an increase in the driving voltage of the element.

Comparative Example 2

An element was produced as in Example 2 except that the green dopant material was not contained in the first light-emitting layer, and was evaluated in the same manner.

TABLE 4

| | First light-emitting layer | | | Second light-emitting layer | Third light-emitting layer |
|---|---|---|---|---|---|
| | Host | Red dopant | Green dopant | Blue dopant | Green dopant |
| | HOMO (H) [eV] / LUMO (H) [eV] | HOMO (RD) [eV] / LUMO (RD) [eV] | HOMO (GD) [eV] / LUMO (GD) [eV] | HOMO (BD) [eV] / LUMO (BD) [eV] | HOMO (GD) [eV] / LUMO (GD) [eV] |
| Example 2 | EM1 −5.11 −1.67 | RD5 −4.72 −2.37 | GD10 −5.05 −1.96 | BD24 −5.32 −1.94 | GD10 −5.05 −1.96 |
| Example 3 | EM1 −5.11 −1.67 | RD5 −4.72 −2.37 | GD9 −5.00 −1.97 | BD9 −5.24 −1.84 | GD9 −5.00 −1.97 |
| Example 4 | EM4 −5.19 −1.66 | RD21 −4.63 −2.24 | GD10 −5.05 −1.96 | BD23 −5.44 −2.06 | GD10 −5.05 −1.96 |
| Example 5 | EM1 −5.11 −1.67 | RD5 −4.72 −2.37 | GD11 −5.00 −1.97 | BD9 −5.24 −1.84 | GD11 −5.00 −1.97 |
| Example 6 | EM1 −5.11 −1.67 | RD5 −4.72 −2.37 | GD27 −4.95 −2.08 | BD23 −5.44 −2.06 | GD27 −4.95 −2.08 |
| Example 7 | EM1 −5.11 −1.67 | RD5 −4.72 −2.37 | GD11 −5.00 −1.97 | BD23 −5.44 −2.06 | GD11 −5.00 −1.97 |
| Example 8 | EM1 −5.11 −1.67 | RD5 −4.72 −2.37 | GD4 −4.70 −1.85 | BD23 −5.44 −2.06 | GD10 −5.05 −1.96 |
| Comparative Example 1 | EM1 −5.11 −1.67 | RD5 −4.72 −2.37 | GD10 −5.05 −1.96 | BD24 −5.32 −1.94 | |

Example 9

An element was produced as in Example 2 except that the stacking order of the second light-emitting layer and the third light-emitting layer was changed, and was evaluated in the same manner.

According to the results, compared with Example 1, the driving voltage of the element was substantially the same, and the luminance of green light emission was decreased by According to the results, compared with Example 1, the during display at 1,000 cd/m², the luminance of red light emission and the luminance of green light emission were decreased by about 50%, and the luminance of blue light emission was increased by about 80%. Thus, the element was a white organic EL element in which the balance of light emission among red, green, and blue was deteriorated. Since green light emission occurred only from the third light-emitting layer, green light emission was decreased by half.

Furthermore, the efficiency of red light emission also decreased. These results show that the balance of light emission among red, green, and blue was poor. That is, since the element did not include the first light-emitting layer among the first to third light-emitting layers in the above embodiment, the element was an organic EL element having a poor balance of light emission.

Comparative Example 3

An element was produced as in Example 2 except that, instead of the green dopant material in the first light-emitting layer, EM27 (calculated values of energy levels: HOMO=−5.73 eV, LUMO=−1.87 eV), which is a non-light-emitting material, was contained as a second host material in an amount of 30% by weight, and was evaluated in the same manner GD10 was contained as a green-light-emitting dopant material in the third light-emitting layer as in Example 2. Since EM27 is a non-light-emitting material, the first light-emitting layer emits monochromatic red light. Comparative Example 3 is an organic EL element having a configuration disclosed in PTL 1.

According to the results, the driving voltage of the element during display at 1,000 cd/m$^2$ was 4.5 V, and, compared with Example 1, the luminance of red light emission was increased by about 80%, and the luminance of green light emission was decreased by about 45%. The element was a white organic EL element which had a high voltage and in which the balance of light emission among red, green, and blue was deteriorated. Specifically, since the element did not include the first light-emitting layer among the first to third light-emitting layers in the above embodiment, the element was an organic EL element having a poor balance of light emission.

Presumably, the change from the green dopant material to the non-light-emitting material increased the luminance of red light emission and decreased the luminance of green light emission. Furthermore, it is considered that since the non-light-emitting material was contained as the second host material in an amount larger than those of the light-emitting materials, the driving voltage of the element increased.

Comparative Example 4

An element was produced as in Comparative Example 2 except that a charge barrier layer formed of HT7 (thickness: 10 nm, calculated values of energy levels: HOMO=−4.92 eV, LUMO=−1.29 eV) was disposed between the first light-emitting layer and the second light-emitting layer, and was evaluated in the same manner Comparative Example 4 is an organic EL element having a configuration disclosed in PTL 4.

According to the results, the driving voltage of the element during display at 1,000 cd/m$^2$ was 4.4 V, and, compared with Example 1, the luminance of red light emission was decreased by about 10%, and the luminance of green light emission was decreased by about 45%. The element was a white organic EL element in which the balance of light emission among red, green, and blue was deteriorated.

Specifically, since the element did not include the first light-emitting layer among the first to third light-emitting layers in the above embodiment, the element was an organic EL element having a poor balance of light emission.

The results show the following. As described above, the deterioration, such as a decrease in red light emission by half as in Comparative Example 2, is avoided by interposing the charge barrier layer in addition to the absence of the first light-emitting layer; however, it is difficult to reduce the driving voltage of the element.

Comparative Example 5

An element was produced as in Comparative Example 4 except that the host material of the first light-emitting layer was changed to EM17 (calculated values of energy levels: HOMO=−4.68 eV, LUMO=−2.07 eV), and was evaluated in the same manner Comparative Example 5 is an organic EL element disclosed in PTL 4.

According to the results, the voltage during display at 1,000 cd/m$^2$ was 4.6 V, and, compared with Example 1, the luminance of green light emission was decreased by about 50%. The element was a white organic EL element in which the balance of light emission among red, green, and blue was deteriorated. Specifically, since the element did not include the first light-emitting layer among the first to third light-emitting layers in the above embodiment, the element was an organic EL element having a poor balance of light emission.

The results show the following. When the charge barrier layer is interposed in addition to the absence of the first light-emitting layer, it is difficult to reduce the driving voltage of the element. When a material having a narrow band gap is used as the host material of the red-light-emitting layer, red light emission is sufficiently obtained, but it is difficult to reduce the driving voltage of the element.

Comparative Example 6

An element was produced as in Example 2 except that the third light-emitting layer was a dual-color light-emitting layer that emitted red light and green light, that contained 0.4% by weight of RD5 and 2.0% by weight of GD10, and that had a thickness of 7 nm as in the first light-emitting layer, and was evaluated in the same manner According to the results, the element was a white organic EL element in which, compared with Example 1, the luminance of red light emission was substantially doubled, the luminance of blue light emission was decreased by about 80%, and the balance of light emission among red, green, and blue was deteriorated. Comparative Example 6 is an organic EL element having a configuration disclosed in PTL 2.

The presence of the two dual-color light-emitting layers, each of which emitted red light and green light, caused the red dopant material to trap many electrons, resulting in the poor balance of light emission among red, green, and blue. Since the third light-emitting layer of Comparative Example 6 had a high red dopant concentration, red light emission was strong. That is, since the element of Comparative Example 6 did not include the third light-emitting layer that emits green light, among the first to third light-emitting layers in the above embodiment, the element was an organic EL element having a poor balance of light emission.

As described above, the present invention can provide an organic EL element which has a good balance of light emission and in which a change in chromaticity of white light emission is small because the element includes the first to third light-emitting layers that emit lights of specific colors.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An organic EL element comprising a first electrode, a second electrode, and a first light-emitting layer, a second light-emitting layer, and a third light-emitting layer that are disposed between the first electrode and the second electrode,
the first light-emitting layer, the second light-emitting layer, and the third light-emitting layer each containing a host material and a light-emitting material,
wherein the first light-emitting layer is a light-emitting layer that emits red light and green light,
the second light-emitting layer is a light-emitting layer that emits blue light, and
the third light-emitting layer is a light-emitting layer that emits green light.

2. The organic EL element according to claim 1, wherein the first light-emitting layer is disposed in contact with the second light-emitting layer and the second light-emitting layer is disposed in contact with the third light-emitting layer, the first light-emitting layer is disposed in contact with the third light-emitting layer and the second light-emitting layer is disposed in contact with the third light-emitting layer, or the second light-emitting layer is disposed in contact with the first light-emitting layer and the first light-emitting layer is disposed in contact with the third light-emitting layer.

3. The organic EL element according to claim 1, wherein the host material of the first light-emitting layer, the host material of the second light-emitting layer, and the host material of the third light-emitting layer are the same material.

4. The organic EL element according to claim 1, wherein the first electrode is a reflective anode, the second electrode is a transmissive cathode, and the anode, the first light-emitting layer, the second light-emitting layer, the third light-emitting layer, and the cathode are disposed in this order.

5. The organic EL element according to claim 1, wherein the first light-emitting layer contains, as the light-emitting material, a green dopant material and a red dopant material, and the green dopant material in the first light-emitting layer has a concentration of 0.1% by weight or more and less than 10% by weight.

6. The organic EL element according to claim 5, wherein the third light-emitting layer is composed only of the host material and the green dopant material.

7. The organic EL element according to claim 1, wherein the third light-emitting layer emits light that does not include a wavelength of red light.

8. The organic EL element according to claim 1, wherein the third light-emitting layer has a thickness of 1 nm or more and less than 5 nm.

9. The organic EL element according to claim 1, wherein the first light-emitting layer contains, as the light-emitting material, a red dopant material and a green dopant material, and relations (i) and (ii) below are satisfied:

$$\text{LUMO}(H) < \text{LUMO}(RD) \qquad (i)$$

$$\text{LUMO}(H) < \text{LUMO}(GD) \qquad (ii)$$

where LUMO (H), LUMO (RD), and LUMO (GD) represent an absolute value of a LUMO energy of the host material, an absolute value of a LUMO energy of the red dopant material, and an absolute value of a LUMO energy of the green dopant material, respectively.

10. The organic EL element according to claim 1, wherein the third light-emitting layer contains, as the light-emitting material, a green dopant material, and the green dopant material satisfies a relation (iii) below:

$$\text{LUMO}(H) < \text{LUMO}(GD) \qquad (iii)$$

where LUMO (H) and LUMO (GD) represent an absolute value of a LUMO energy of the host material and an absolute value of a LUMO energy of the green dopant material, respectively.

11. The organic EL element according to claim 1, wherein the second light-emitting layer contains, as the light-emitting material, a blue dopant material, and the blue dopant material satisfies relations (iv) and (v) below:

$$\text{LUMO}(H) < \text{LUMO}(BD) \qquad (iv)$$

$$\text{HOMO}(H) < \text{HOMO}(BD) \qquad (v)$$

where LUMO (H) and LUMO (BD) represent an absolute value of a LUMO energy of the host material and an absolute value of a LUMO energy of the blue dopant material, respectively, and HOMO (H) and HOMO (BD) represent an absolute value of a HOMO energy of the host material and an absolute value of a HOMO energy of the blue dopant material, respectively.

12. The organic EL element according to claim 1, wherein the host material is an aromatic hydrocarbon compound optionally having an alkyl group having 1 to 12 carbon atoms, and the aromatic hydrocarbon compound includes a structure selected from benzene, naphthalene, fluorene, benzofluorene, phenanthrene, chrysene, triphenylene, pyrene, fluoranthene, and benzofluoranthene.

13. The organic EL element according to claim 4, further comprising a hole blocking layer that is disposed between the third light-emitting layer and the cathode and is in contact with the third light-emitting layer, wherein a material constituting the hole blocking layer consists of a hydrocarbon.

14. The organic EL element according to claim 4, further comprising an electron blocking layer that is disposed between the first light-emitting layer and the anode and is in contact with the first light-emitting layer, wherein a LUMO of the electron blocking layer is higher than a LUMO of the host material.

15. The organic EL element according to claim 13, characterized by comprising an electron transport layer disposed between the hole blocking layer and the cathode, wherein a material constituting the electron transport layer has a pyridinediyl group or a phenanthrolinediyl group.

16. A display apparatus comprising a plurality of pixels, wherein at least one of the pixels includes the organic EL element according to claim 1 and an active element connected to the organic EL element.

17. An imaging apparatus comprising an optical unit including a plurality of lenses, an imaging element that receives light which has passed through the optical unit, and a display unit that displays an image,
wherein the display unit is a display unit that displays an image captured by the imaging element, and the display unit includes the organic EL element according to claim 1.

18. An electronic device comprising a housing, a communication unit that communicates with an external unit, and a display unit,
wherein the display unit includes the organic EL element according to claim 1.

19. An illumination apparatus comprising a light source, and a light diffusion unit or an optical film, wherein the light source includes the organic EL element according to claim 1.

20. A moving object comprising a body, and a lighting fixture disposed on the body,
wherein the lighting fixture includes the organic EL element according to claim 1.

* * * * *